United States Patent
Banerjee et al.

(10) Patent No.: US 10,672,966 B2
(45) Date of Patent: Jun. 2, 2020

(54) METHOD OF PRODUCING THERMOELECTRIC MATERIAL

(71) Applicants: Toyota Motor Engineering & Manufacturing North America, Inc., Erlanger, KY (US); Toyota Jidosha Kabushiki Kaisha, Toyota-shi Aichi-ken (JP)

(72) Inventors: Debasish Banerjee, Ann Arbor, MI (US); Michael Paul Rowe, Pinckney, MI (US); Li Qin Zhou, Ann Arbor, MI (US); Minjuan Zhang, Ann Arbor, MI (US); Takuji Kita, Susono (JP)

(73) Assignees: TOYOTA MOTOR ENGINEERING & MANUFACTURING NORTH AMERICA, INC., Plano, TX (US); TOYOTA JIDOSHA KABUSHIKI KAISHA, Toyota-shi (JP)

(*) Notice: Subject to any disclaimer, the term of this patent is extended or adjusted under 35 U.S.C. 154(b) by 396 days.

(21) Appl. No.: 14/303,878

(22) Filed: Jun. 13, 2014

(65) Prior Publication Data
US 2014/0290711 A1    Oct. 2, 2014

Related U.S. Application Data

(63) Continuation-in-part of application No. 13/548,395, filed on Jul. 13, 2012, which is a continuation-in-part of application No. 13/117,286, filed on May 27, 2011.

(51) Int. Cl.
*H01L 35/26* (2006.01)
*C04B 35/547* (2006.01)
(Continued)

(52) U.S. Cl.
CPC .............. *H01L 35/26* (2013.01); *B82Y 30/00* (2013.01); *C01B 19/002* (2013.01);
(Continued)

(58) Field of Classification Search
CPC ........ H01L 35/16; H01L 35/18; H01L 35/25; H01L 35/22; H01L 35/26; H01L 35/32; H01L 35/34
(Continued)

(56) References Cited

U.S. PATENT DOCUMENTS 5,929,351 A * 7/1999 Kusakabe ............... H01L 35/18
                                                                136/201
7,195,721 B2    3/2007 Gurin
(Continued)

FOREIGN PATENT DOCUMENTS

EP    1187230 A2    3/2002
JP    2002076452 A   3/2002
(Continued)

OTHER PUBLICATIONS

Popescu et al., Model of transport properties of thermoelectric nanocomposite materials, Physical Review B 79 (2009).
(Continued)

*Primary Examiner* — Andrew J Golden
(74) *Attorney, Agent, or Firm* — Dinsmore & Shohl LLP

(57) ABSTRACT

A process for manufacturing a thermoelectric material having a plurality of grains and grain boundaries. The process includes determining a material composition to be investigated for the thermoelectric material and then determining a range of values of grain size and/or grain boundary barrier height obtainable for the material composition using current state of the art manufacturing techniques. Thereafter, a range of figure of merit values for the material composition is determined as a function of the range of values of grain size and/or grain boundary barrier height. And finally, a thermoelectric material having the determined material composition and an average grain size and grain boundary barrier
(Continued)

height corresponding to the maximum range of figure of merit values is manufactured.

13 Claims, 10 Drawing Sheets

(51) Int. Cl.
  *B82Y 30/00* (2011.01)
  *C04B 35/01* (2006.01)
  *C01B 19/00* (2006.01)
  *H01L 35/16* (2006.01)
  *C04B 35/26* (2006.01)
  *C04B 35/645* (2006.01)
(52) U.S. Cl.
  CPC ............ *C04B 35/016* (2013.01); *C04B 35/26* (2013.01); *C04B 35/547* (2013.01); *C04B 35/645* (2013.01); *H01L 35/16* (2013.01); *C01P 2002/72* (2013.01); *C01P 2004/04* (2013.01); *C01P 2004/64* (2013.01); *C01P 2006/40* (2013.01); *C04B 2235/3279* (2013.01); *C04B 2235/3281* (2013.01); *C04B 2235/3284* (2013.01); *C04B 2235/3293* (2013.01); *C04B 2235/3298* (2013.01); *C04B 2235/449* (2013.01); *C04B 2235/763* (2013.01); *C04B 2235/77* (2013.01); *C04B 2235/85* (2013.01); *C04B 2235/9607* (2013.01); *C04B 2235/9615* (2013.01)
(58) Field of Classification Search
  USPC ......... 136/200–242; 252/518.1, 519.4, 519.5
  See application file for complete search history.

(56) References Cited

U.S. PATENT DOCUMENTS

| | | | |
|---|---|---|---|
| 7,734,428 B2 | 6/2010 | Banerjee et al. | |
| 8,419,980 B2 | 4/2013 | Rowe et al. | |
| 2008/0087314 A1 | 4/2008 | Xiao et al. | |
| 2008/0202575 A1* | 8/2008 | Ren | H01L 35/16 136/201 |
| 2010/0059723 A1* | 3/2010 | Lee | H01L 35/16 252/520.2 |
| 2010/0108115 A1 | 5/2010 | Lee et al. | |
| 2010/0171546 A1 | 7/2010 | Kwok et al. | |
| 2011/0143489 A1 | 6/2011 | Korevaar | |
| 2012/0114961 A1* | 5/2012 | Lee | H01L 35/16 428/570 |
| 2012/0138873 A1* | 6/2012 | Zhou | H01L 35/16 252/519.4 |
| 2012/0298924 A1* | 11/2012 | Banerjee | H01L 35/34 252/500 |

FOREIGN PATENT DOCUMENTS

| | | | | |
|---|---|---|---|---|
| JP | WO 2011086464 A2 * | 7/2011 | ............ | H01L 35/26 |
| WO | 2010/041146 A2 | 4/2010 | | |

OTHER PUBLICATIONS

Moyzhes et al, Thermoelectric figure of merit of metal-semiconductor barrier structure based on energy relaxation length, Applied Physics Letters, vol. 73, No. 13, Sep. 28, 1998.

* cited by examiner

METHOD OF PRODUCING THERMOELECTRIC MATERIAL

CROSS REFERENCE TO RELATED APPLICATIONS

The present application is a continuation-in-part (CIP) of U.S. patent application Ser. No. 13/548,395 filed on Jul. 13, 2012, which in turn is a CIP of U.S. patent application Ser. No. 13/117,286 filed on May 27, 2011, both of which are incorporated herein in their entirety by reference.

FIELD OF THE INVENTION

This invention relates to materials having thermoelectric properties and to thermoelectric devices.

BACKGROUND OF THE INVENTION

A thermoelectric device can be used to obtain electrical energy from a thermal gradient (for example, a thermoelectric generator using the Seebeck effect), or to generate a thermal gradient from electrical energy (for example, a thermoelectric refrigerator using the Peltier effect). The discussion below is directed to the Seebeck effect, but the general concepts also apply to applications of the Peltier effect.

A typical thermoelectric device is built up from several unicouples, which are typically pairs of thermally conductive p-type (P) and n-type (N) semiconductors. These unicouples are connected electrically in series and thermally in parallel. Theoretically, the maximum efficiency of the conversion of heat energy to electrical energy is given by:

$$\zeta_{max} = \frac{(T_H - T_C)}{T_H} \frac{\sqrt{1 + ZT_{ave}} - 1}{\sqrt{1 + ZT_{ave}} + T_C/T_H}$$

where $T_{ave}=(T_H+T_C)/2$ is the average temperature of thermal gradient having a hot temperature ($T_H$) end and a cold temperature ($T_C$) end, and Z is a figure of merit, defined as $Z=S^2\sigma/\kappa$. The figure of merit Z depends on the macroscopic transport parameters of the materials, namely the Seebeck coefficient (S), electrical conductivity ($\sigma$), and thermal conductivity ($\kappa$). A large figure of merit is provided by a thermoelectric material having a large Seebeck coefficient, high electrical conductivity, and low thermal conductivity.

The Seebeck coefficient is further defined as the ratio of the open-circuit voltage to the temperature difference between the hot and cold junctions of a circuit exhibiting the Seebeck effect, or $S=V/(T_H-T_C)$. Since Z varies with temperature, a useful dimensionless figure of merit can be defined as ZT.

By the end of the 1950s, the best bulk thermoelectric materials were found to be alloys of bismuth telluride and antimony, which gave a room temperature ZT~1. Workers in the thermoelectric field have been attempting to improve the figure of merit over the past 40 years without much success. Increasing ZT is difficult because the three parameters S, $\sigma$, and k are all related to the free carrier concentration and are usually not independent. For example, doping typically increases the semiconductor's electrical conductivity, but decreases its Seebeck coefficient and increases the thermal conductivity. Efforts to reduce the lattice thermal conductivity by alloying also reduce the electrical conductivity by providing an extra scattering mechanism.

Dresselhaus and coworkers at MIT theoretically demonstrated that quantum confinement of electrons and phonons within nanowires of a thermoelectric material can increase the value of ZT. 1-D nanowires in particular could reach the value of ZT. 1-D nanowires in particular could reach $ZT\approx2-5$ if the nanowire diameter lies in the range of 5-10 nanometers. Certain structures have been investigated, for example such as described in Heremans, J. P. et al., "Thermoelectric Power of Bismuth Nanocomposites"; Phys. Rev. Lett.; 2002, 88, 216801; Venkatasubramanian, R. et al., "Thin-film thermoelectric devices with high room temperature figures of merit"; Nature; 2001, 413, 597-602; Harman, T. C. et al., "Thermoelectric quantum dot superlattices with high ZT"; Electron. Mater.; 2000, 29, L1-L4; Rabin, O. et al., "Anomalously high thermoelectric figure of merit in $Bi_{1-x}Sb_x$ nanowires by carrier pocket alignment"; APL; 2001, 79, 81-83; and Dresselhaus, M. S. et al., "Low-dimensional thermoelectric materials"; PSS; 1999, 41, 679-682. However, these approaches do not provide a simple approach to making large-scale, low-cost thermoelectric devices. Conventional semiconductor device fabrication methods are unsuitable for manufacturing bulk samples, and are often expensive.

In automobiles, about 70 percent of energy derived from fuel is lost to waste heat and engine cooling. Only a small proportion of energy provided by fuel combustion is used, and a large amount of thermal energy is thrown away. Recovery of waste thermal energy is a big challenge in automotive industries due to the increasing energy crisis. Thermoelectric conversion of thermal energy to electrical energy could be an effective way to obtain electrical energy from otherwise wasted heat production. However, direct thermal to electric conversion (DTEC) technology currently faces two major challenges: low conversion efficiency and insufficient power density. Hence, improved materials and devices having high thermoelectric conversion efficiency are urgently required.

In response to the need for high thermoelectric conversion efficiency materials, Zhang et al. have investigated thermoelectric materials comprising two or more components, at least one of which is a thermoelectric material (U.S. Pat. No. 7,309,830). However, a given thermoelectric material system can have a wide range of compositions that may, or may not, exhibit high ZT values, and as such, Banerjee et al. have developed a process for determining an optimum range of compositions for a nanocomposite thermoelectric material system (U.S. Pat. No. 7,734,428).

In addition to the above, other factors such as grain size and grain boundary properties have been postulated to affect the properties of thermoelectric materials. However, as of yet no process has been developed to determine if there is and/or which optimum range of such factors can provide a thermoelectric material with an improved ZT. Therefore, a process to model, calculate and/or determine an optimum range of grain related properties in which a thermoelectric material exhibits high ZT values would be desirable.

SUMMARY OF THE INVENTION

A process for manufacturing a thermoelectric material having a plurality of grains and grain boundaries is provided. The process includes determining a material composition to be investigated for the thermoelectric material and then determining a range of values of grain size and/or grain boundary barrier height obtainable for the material composition using current state of the art manufacturing techniques. Thereafter, a plurality of Seebeck coefficients for the material composition as a function of the range of values for the grain size and/or grain boundary barrier height are calculated. In addition, a plurality of electrical resistivity values and a plurality of thermal conductivity values for the material composition and as a function of the range of values for the grain size and/or grain boundary barrier height are calculated.

Once such plurality of values have been determined, a range of figure of merit values for the material composition as a function of the calculated Seebeck coefficients, calculated electrical resistivity values, and calculated thermal conductivity values are determined/calculated. Based on the range of figure of merit values, a generally maximum range thereof for the material composition is determined, a thermoelectric material having the determined material composition and an average grain size and grain boundary barrier height corresponding to the maximum range of figure of merit values is manufactured.

The material composition of the thermoelectric material can be a bulk thermoelectric material composition, or in the alternative, a nanocomposite thermoelectric material composition. The range of values of grain size can be between 5 and 100 nanometers while the range of values of grain boundary barrier height can be between 10 and 300 milli-electron volts.

In some instances, the nanocomposite thermoelectric material can have a first matrix phase, an inter-grain phonon scattering second phase and a plurality of third phase grain boundaries. The first matrix phase has an average grain size within a range of 5-100 nm, preferably within 5-50 nm and more preferably within 5-25 nm. The inter-grain scattering second phase can be a plurality of oxide nanoparticles that have an average diameter within a range of 2-100 nm, preferably 4-50 nm and more preferably 6-14 nm. Also, the plurality of third phase grain boundaries have an average width within a range of 2-75 nm, preferably 5-70 nm, more preferably 10-70 nm, even more preferably 15-65 nm and still yet more preferably 27-61

The grain size of the manufactured thermoelectric material can be obtained by consolidating a plurality of nanoparticles having a mean diameter generally equal to less than the grain size and the grain boundary barrier height can be obtained by doping of the thermoelectric material, altering a surface of a plurality of nanoparticles used to manufacture the thermooelectric material, and the like.

DETAILED DESCRIPTION OF THE INVENTION

Figure 1A:
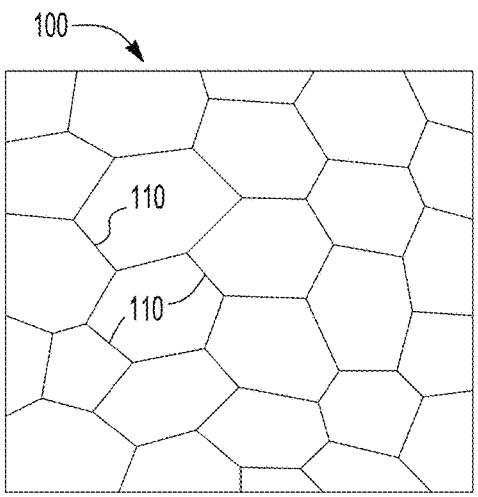
FIGS. 1a-1d are schematic illustrations of: (a) the grain structure of a prior art thermoelectric material; (b) a schematic illustration of a thermoelectric material having altered grain boundaries according to an embodiment of the present invention; (c) a schematic illustration of a prior art nanocomposite thermoelectric material; and (d) a schematic illustration of a nanocomposite thermoelectric material having modified grain boundaries according to an embodiment of the present invention.

The present invention discloses a process for determining an optimum range of compositions for a thermoelectric material system, within which the material system may exhibit generally high figure of merit values. As such, the process has utility for improving the efficiency of experimental design and production of thermoelectric materials.

The process for determining an optimum range of compositions for a thermoelectric material system considers a variety of relevant factors, parameters and the like in order to determine which material systems should be considered and/or which range of compositions should be studied in more detail. A thermoelectric material exhibiting a dimensionless high figure of merit (ZT) needs to possess a high Seebeck coefficient (S) for high voltage generation, a low electrical resistivity (ρ) to minimize Ohmic losses and a low thermal conductivity (κ) to minimize heat conduction.

The relationship between ZT, S, ρ, and κ can be expressed as:

$$ZT = S^2 T/\kappa \rho \qquad \text{Eqn 1}$$

and/or as:

$$ZT = \frac{S^2 T}{\rho(k_{el} + k_{ph})} \qquad \text{Eqn 2}$$

where $\kappa_{el}$ and $\kappa_{ph}$ are the electronic and phonon contribution to the overall thermal conductivity k.

Typically, S, ρ, and κ are interdependent with an increase of the Seebeck coefficient resulting in an increase in electrical resistivity, whereas a decrease in the electrical resistivity results in an increase of the thermal conductivity. At least one approach for obtaining high figure of merit values has investigated the insertion of nanoparticles within a thermoelectric material (U.S. Pat. No. 7,309,830). Materials using this approach can result in phonons being scattered by the nanoparticles, thereby reducing the lattice thermal conductivity while leaving the electrical resistivity and Seebeck coefficient for the thermoelectric host matrix unchanged.

Elemental substitutions, also known as atomic substitutions, in potential thermoelectric materials have imperfections on the order of 1 angstrom (Å). Thus alloying additions can result in the scattering of short-wavelength phonons much more effectively than mid- and long-wavelength phonons. Therefore, mid- and long-wavelength phonons dominate the heat conduction in alloys and thermoelectric materials that have been doped with other elements not originally within the starting material. In the alternative, the inclusion of additions such as nanoparticles in the size range of phonon wavelengths introduces another scattering mechanism that affects mid- and/or long-wavelength phonons, thereby providing an opportunity to reduce the thermal conductivity of such materials below the alloy limit. However, which nanoparticles with respect to their composition, size and size distribution, and which host matrix the nanoparticles should be added to has heretofore been a difficult task to predict. In response to the difficulty in predicting successful thermoelectric material systems, a process to perform just this task has been developed by Banerjee et al. (U.S. Pat. No. 7,734,428).

An embodiment of the current process includes determining a material composition to be investigated for the thermoelectric material and determining a range of values for a grain related property that is obtainable for the material composition using state of the art manufacturing techniques. Once the material composition and the range of values for the grain related property have been determined, a plurality of Seebeck coefficients for the material composition as a function of the range of values can be calculated. In addition, a plurality of electrical resistivity values and a plurality of thermal conductivity values for the material composition as a function of the range of values for the grain related property can also be calculated.

It is appreciated that once the plurality of Seebeck coefficients, electrical resistivity values, and thermal conductivity values have been determined, a range of figure of merit values as a function thereof can be calculated and a generally maximum range of figure of merit values can be determined, such values being a function of the range of values of the grain related property. Naturally, once the maximum range of figure of merit values has been determined, a thermoelectric material having the determined material composition and the grain related property(ies) corresponding to the maximum range of figure of merit values is manufactured.

In the alternative to the above outlined embodiment, a plurality of material compositions can be investigated in this manner and a single material composition or a limited range of compositions having a potential and desired ZT are manufactured.

The grain related property can include any grain related property known to those skilled in the art, illustratively including grain size, grain boundary barrier height, and the like. For the purposes of the present invention, the term "grain size" is defined as the average mean diameter of grains within a thermoelectric material obtained through any method and/or technique known to those skilled in the art. For example and for illustrative purposes only, a grain size can be determined by taking a statistical average of a plurality of grain diameters from a metallographic cross-section of the material with a single grain diameter obtained by averaging at least two linear and orthogonal measurements across a given grain.

Also for the purposes of the present invention, the term "grain boundary barrier height" is defined as the energy potential of a grain boundary that will scatter an electron having less energy than the potential and allow an electron having more energy than the potential to pass therethrough.

The material composition to be investigated can be a bulk thermoelectric material composition, or in the alternative, a nanocomposite thermoelectric material composition. It is appreciated that the term "bulk thermoelectric material" refers to a polycrystalline material without the presence of second phase particles such as nanoparticles of an insulating type material. In the alternative, the term "nanocomposite thermoelectric material" refers to a bulk thermoelectric material having second phase particles such as nanoparticle insulating material inclusions, e.g. nanoparticle inclusions such as silicon oxide, zinc oxide, and the like.

The range of values for grain size of the material composition to be investigated can be between 5 and 100 nanometers (nm) while the range of values of grain boundary barrier height can be between 10 and 300 milli-electron volts (meV). In addition, the grain size of the manufactured thermoelectric material can be obtained by consolidating a plurality of nanoparticles having a mean diameter that is less than or generally equal to the final grain size of the material. The grain boundary barrier height of the manufactured thermoelectric material can be altered and/or obtained by doping of the material and/or altering a surface of the plurality of nanoparticles used to manufacture the thermoelectric material. In some instances, the surface of the plurality of nanoparticles is altered by applying a coating thereon before the nanoparticles are consolidated to produce the thermoelectric material.

Not being bound by theory, it is appreciated that a grain boundary is a result of and/or forms from a crystallographic misalignment between adjacent grains. In addition, the misalignment results in a residual electric charge across the grain boundary which can produce an electrostatic potential commonly referred to as an interfacial barrier and/or grain boundary barrier height which can be measured using AC impedance. As a first approximation, the magnitude of this interfacial barrier, also known as the grain boundary barrier height, can be calculated from the expression:

$$E_b = \frac{eN_t^2}{8\varepsilon N_D} \quad \text{Eqn 3}$$

where $N_t$ is the number density of traps, $\varepsilon$ is the permittivity and $N_D$ is the doping concentration. The trap density is generally unknown and can vary widely, however assuming a generally high doping level and reported values for $N_t$ in the range of $10^{-11}$-$10^{-13}$ cm$^{-3}$, an $E_b$ of around 25 meV can be calculated.

Figure 1B:
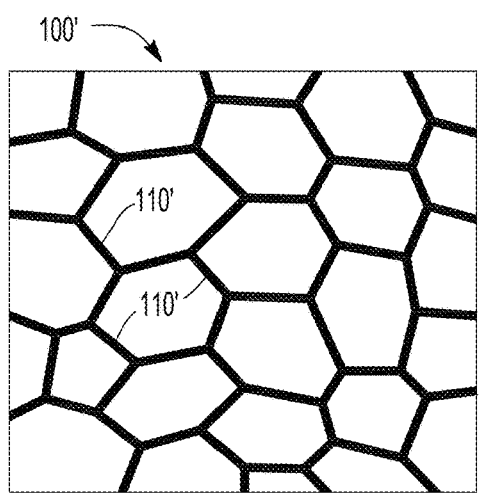
Figure 1C:
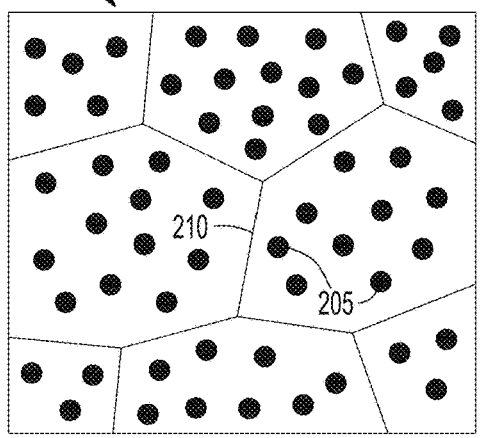
Figure 1D:
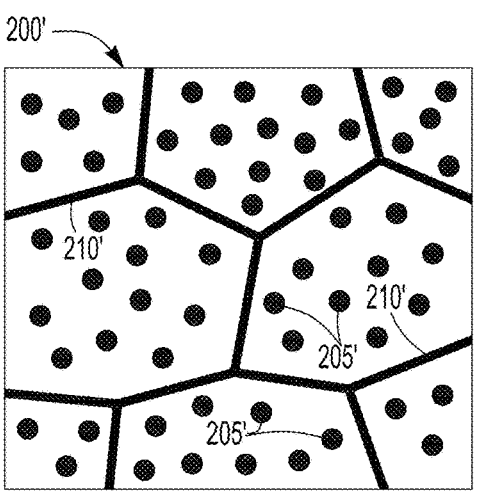

The process can provide a thermoelectric material as schematically illustrated in FIGS. 1a and 1d. In particular, FIG. 1b illustrates a bulk thermoelectric material 100' having altered and/or engineered grain boundaries 110' when compared to the grain boundaries 110 of the material 100 illustrated in FIG. 1a. In addition, FIG. 1d illustrates a nanocomposite thermoelectric material 200' having altered and/or engineered grain boundaries 210' in addition to nanoparticle inclusions 205 when compared to the material 200 having the nanoparticles 205 and grain boundaries 210.

The grain size of the thermoelectric material 100 and/or 200 can be altered and/or engineered, e.g. by using nanoparticles with a desired average size to consolidate and manufacture the material. In addition, local electronic and thermal properties of the grain boundaries can be altered and/or engineered by controlling the interfacial composition between the grains, that is the interfacial composition of the grain boundaries. For example and for illustrative purposes only, a second phase can be engineered to be present at the interface between the grains such as $Pb_{0.75}Sn_{0.25}Se$ coatings on $Pb_{0.75}Sn_{0.25}Te$; $CoSb_3$ coatings on $La_{0.9}CoFe_3Sb_{12}$; and alkali-metal salt coatings on $(Bi_{0.2}Sb_{0.8})_2Te_3$. In fact, results from $CoSb_3/La_{0.9}CoFe_3Sb_{12}$ and coated $(Bi_{0.2}Sb_{0.8})_2Te_3$ materials have shown moderate improvements in the figure of merit ranging from 15-30%.

In order to incorporate a grain related property into a modeling and/or manufacturing process, the scattering behavior of electrons, holes and/or phonons within a material can be useful. Not being bound by theory, a theoretical simulation can be based on the Boltzmann equation with relaxation time approximation. For example, a modified Callaway model with respect to the lattice of a thermoelectric material can be incorporated with scattering of phonons through grain boundaries, defects, nanoparticles, and the like provided by Equation 4 below:

$$\tau_c^{-1} = \tau_B^{-1} + \tau_U^{-1} + \tau_N^{-1} + \tau_A^{-1} + \tau_D^{-1} \quad \text{Eqn 4}$$

where $\tau$ corresponds to scattering time and the subscripts B, U, N, A and D correspond to boundary, Umpklamp, normal, alloy, and nanoparticle, respectively, related scattering.

With respect to carriers, that is electrons and holes, Equation 5 can be used where Op, DOp, and DAp represent optical phonon, deformation potential of optical phonon, and deformation potential of acoustic phonon related scattering.

$$\tau_g^{-1} = \tau_{Op}^{-1} + \tau_{DOp}^{-1} + \tau_{DAp}^{-1} \quad \text{Eqn 5}$$

In addition to scattering time, the total electrical conductivity can be expressed as a summation of the contributions from both electron and hole bands, while the overall Seebeck coefficient can be obtained through weighting each band's contribution using a normalized electrical conductivity. In order to obtain the electronic thermal conductivity, the electronic thermal conductivity from the Lorentz number (L) can be obtained using Equations 6-8 below. In particular, Equation 6 is an expression of the total electrical conductivity ($\sigma$), Equation 7 is an expression of the overall Seebeck coefficient, and Equation 8 is an expression for the electronic thermal conductivity. It is appreciated that the bipolar thermal conductivity contribution to the electronic thermal conductivity must also be considered and that this type of conduction occurs when carriers moving between different bands carry heat via the Peltier effect and as such can still transport heat even if the net electric current is zero.

$$\sigma = \sum_i^{e,h} \sigma_i \quad \text{Eqn 6}$$

$$S = \sum_i^{e,h} \frac{S_i \sigma_i}{\sigma} \quad \text{Eqn 7}$$

$$k_e = \left(\frac{k_B}{e}\right)^2 \left(\sum_i^{e,h} L_i + L_b\right) \sigma T \quad \text{Eqn 8}$$

In addition to the above, the nature of grain boundary scattering exhibited by carriers can be estimated from the electron wavelength and electron mean free path (MFP) and the cumulative distribution function of the electron occupation number versus electron energy can provide the percentage of electrons that have energy less than a certain value. In particular, Equations 9-13 afford for the electron MFP, electron wavelength, and carrier percentage occupation as a function of dimensionless electron energy shown in FIG. 2 where the electron MFP can be calculated using the expression $l = v\tau$ where $v$ and $\tau$ are provided by Equations 11 and 4, respectively, g is the density of state function and a is equal to the inverse of the bandgap for the material ($1/E_g$), in some instances referred to as the parabolicity factor.

$$g = \frac{\int_0^{E/k_B T} g(E)dE}{\int_0^\infty g(E)dE} \quad \text{Eqn 9}$$

$$g(E) = v^2 D(E)\left(-\frac{\partial f}{\partial E}\right) \quad \text{Eqn 10}$$

$$v = \frac{(2E(1+\alpha E)/m_c^*)^{0.5}}{(1+2\alpha E)} \quad \text{Eqn 11}$$

$$D(E) = \frac{\sqrt{2}\,(m_d^*)^{1.5}}{\pi^2 \hbar^3} E(1+2\alpha E)(1+\alpha E) \quad \text{Eqn 12}$$

$$\lambda = \frac{2\pi\hbar}{m_c^* v} = \frac{2\pi\hbar(1+2\alpha E)}{\sqrt{2m_c^* E(1+\alpha E)}} \quad \text{Eqn 13}$$

Figure 2:
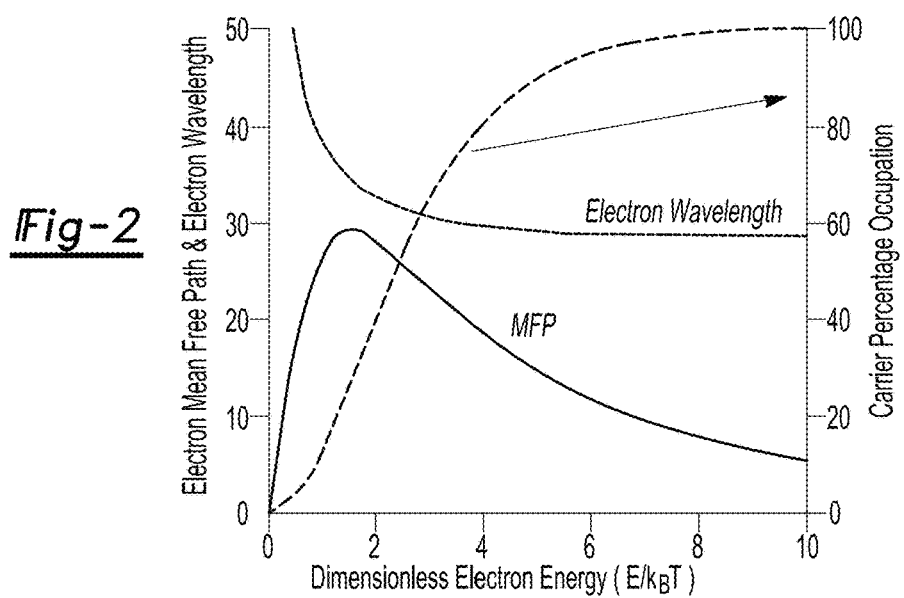
FIG. 2 is a graph illustrating calculated electron mean free path, electron wavelength, and carrier percentage occupation as a function of dimensionless electron energy.

As shown in FIG. 2, the majority of electrons have a MFP less than 30 nanometers which is comparable and/or of the same order of magnitude of a grain size of between 20 to a few hundred nanometers. As such, FIG. 2 confirms that a majority of carriers will experience multiple scattering due to the grain boundaries and "memory" of a previous collision by a carrier will be retained by the carrier when it reaches another portion of the grain interface, i.e. each scattering point on a grain boundary is not independent from others. In addition, since the dominant electron wavelength is approximately 28 nm and an assumed grain boundary width of 1 to 2 nm is much smaller, there is no possibility of diffuse scattering of electrons. Finally, the electron MFP of less than 30 nanometers is comparable to a hole wavelength of 28 nm which implies that the Boltzmann equation is at the edge of its validity using this process. As such, it is appreciated that other expressions with respect to relaxation time approximation can be used for the basis of a theoretical simulation that incorporates grain boundary effect in determining various properties of a thermoelectric material and still fall within the scope of the present invention.

Figure 3:
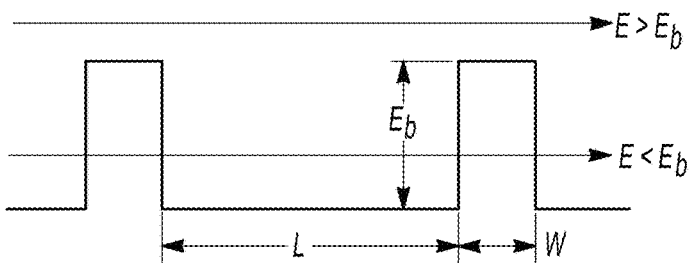
FIG. 3 is a schematic illustration of a model for treatment of grain boundary barrier height according to an embodiment of the present invention.

Turning now to the actual effect of grain boundary properties on thermoelectric characteristics, FIG. 3 provides a model of a grain having a grain boundary with a width w and a grain boundary potential barrier of $E_b$. In addition, the grain size has a dimension of L which naturally separates the grain boundary on opposing sides of the grain. As illustrated in the figure, if an electron has an energy of E, the electron will pass through the grain boundary barrier height if $E>E_b$ and will scatter if $E<E_b$.

Not being bound by theory, assuming T(E) is a transmission probability of an electron passing through a grain boundary barrier height and there are N grain boundaries, the MFP of the electron due to scattering by the grain boundary can be expressed as Equation 14 when N is assumed to be infinity.

$$\lambda_{grainboundary} = \sum_{n=1}^{N \to \infty} T(E)^n (1 - T(E))nL = \frac{T(E)L}{1 - T(E)} \qquad \text{Eqn 14}$$

which further provides a relaxation time of:

$$\tau_B = \lambda_{grainboundary}/v \qquad \text{Eqn 15}$$

where v is given by:

$$\tau_B = \frac{L}{v}\left(1 + \frac{4\frac{E}{E_b}\left|1 - \frac{E}{E_B}\right|}{\sinh^2\left|\sqrt{\frac{2m_c^* E_B w^2}{\hbar^2}}\left|1 - \frac{E}{E_B}\right|\right|}\right) \qquad \text{Eqn 16}$$

Figure 4:
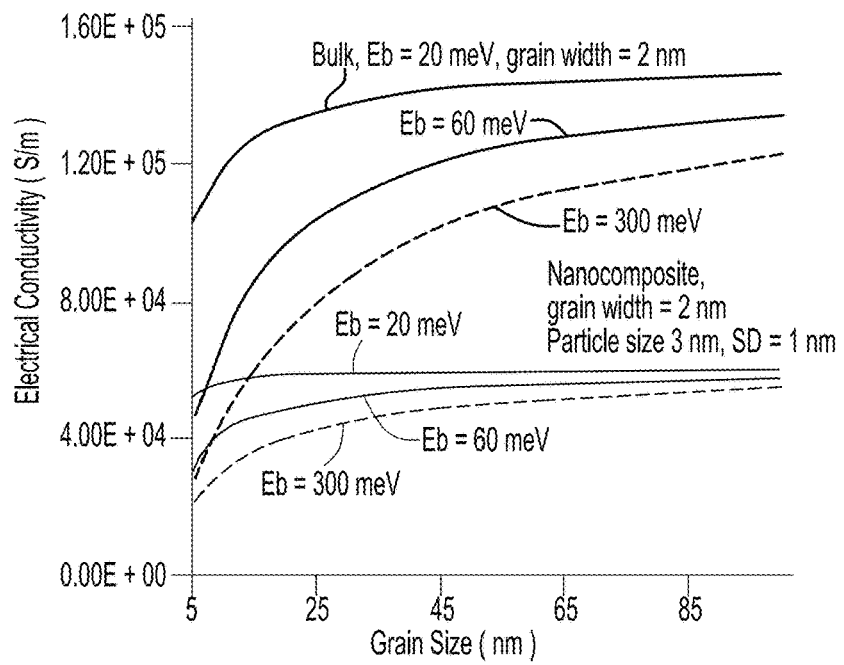
FIG. 4 is a graph illustrating effect of grain boundary properties on electrical conductivity.

In order to better understand the effect of grain related properties on the thermoelectric material behavior, and based on the model shown in FIG. 3, the effect of grain size on electrical conductivity was examined with results shown in FIG. 4. The width w of the grain boundaries was assumed to be constant at 2 nm while the grain boundary barrier height was varied from 20 meV to 300 meV. In addition, the electrical conductivity of a bulk thermoelectric material and a nanocomposite thermoelectric material was investigated and is shown in the graph. In the case of the nanocomposite thermoelectric material, $SiO_2$ nanoparticles of 3 nm diameter were used for the calculations. It is appreciated that FIG. 4 illustrates that with increasing grain size, the electrical conductivity increases, which can be explained due to decreasing probability of scattering events. In addition, with the inclusion of ceramic nanoparticles within the material, significantly lower electrical conductivities were observed. Finally, varying the grain boundary barrier height significantly affects the conductivities of both the bulk thermoelectric material and the nanocomposite thermoelectric material. It is appreciated that this effect is stronger at smaller grain sizes simply due to the fact that smaller grains increase the number of scattering events and thus reduce a carrier MFP.

Figure 5:
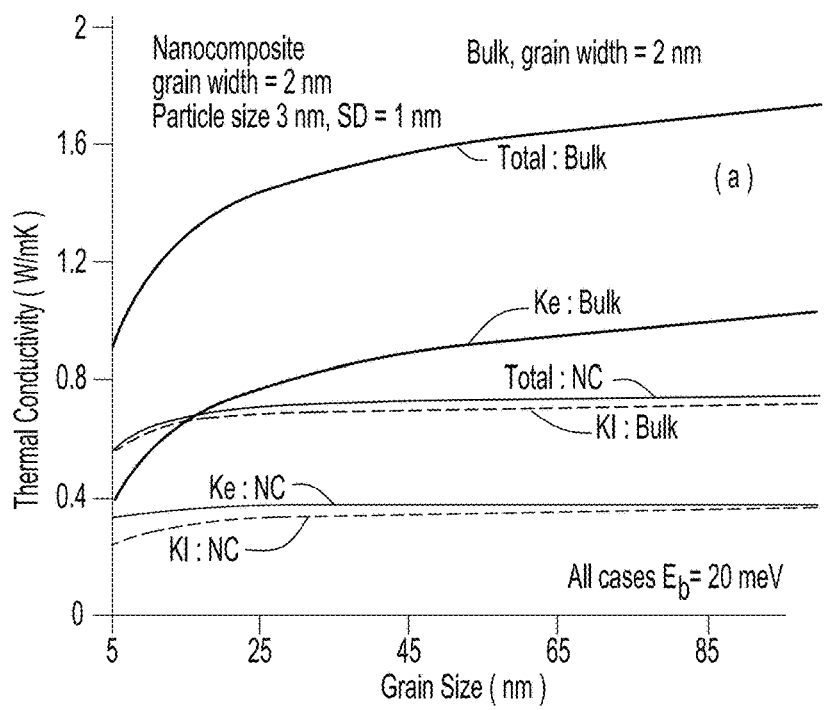
FIG. 5 is a graph illustrating effect of grain size on lattice (Kl) and electronic (Ke) thermal conductivity.
Figure 6:
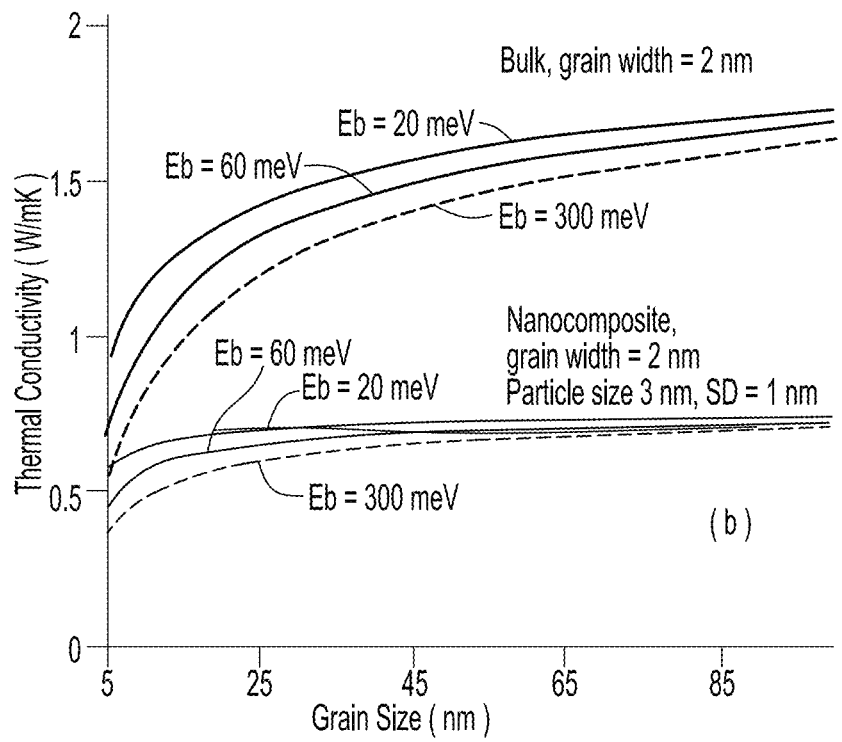
FIG. 6 is a graph illustrating effect of grain boundary properties on total thermal conductivity.

Turning now to FIG. 5, a graph illustrating the lattice and electronic thermal conductivity as a function of grain size is shown. Similar to FIG. 4, grain boundary scattering clearly affects both lattice and electronic thermal conductivity with the most significant effect occurring for grain sizes below 25 nm. In addition, FIG. 6 illustrates that total thermal conductivity illustrates a similar behavior to electrical conductivity which provides evidence that reduction in grain size for a thermoelectric material can be an effective way of reducing the material's thermal conductivity.

Figure 7:
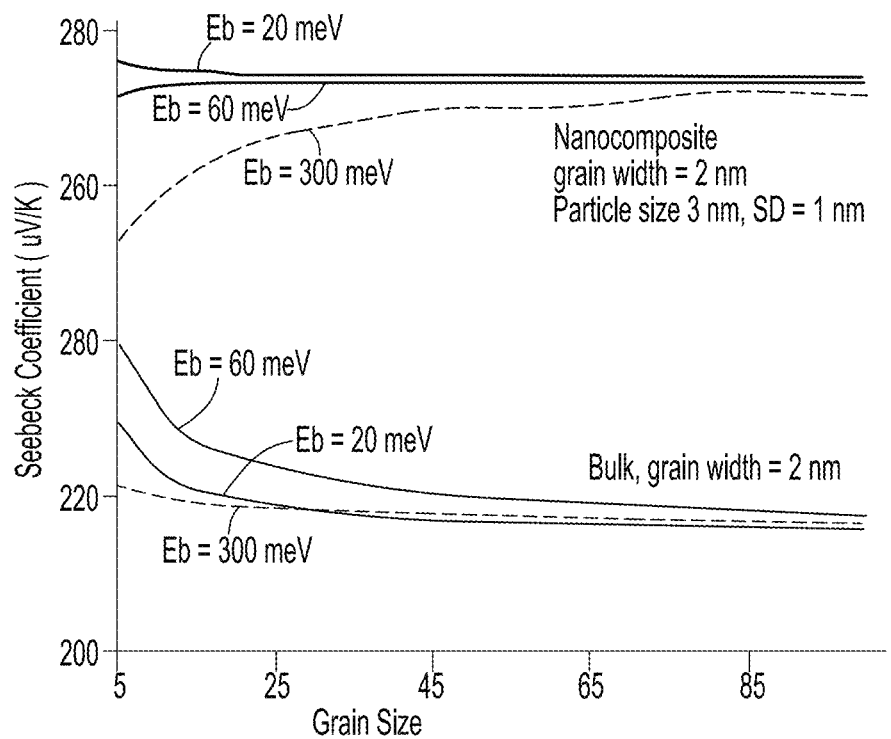
FIG. 7 is a graph illustrating effect of grain boundary properties on Seebeck coefficient.
Figure 8:
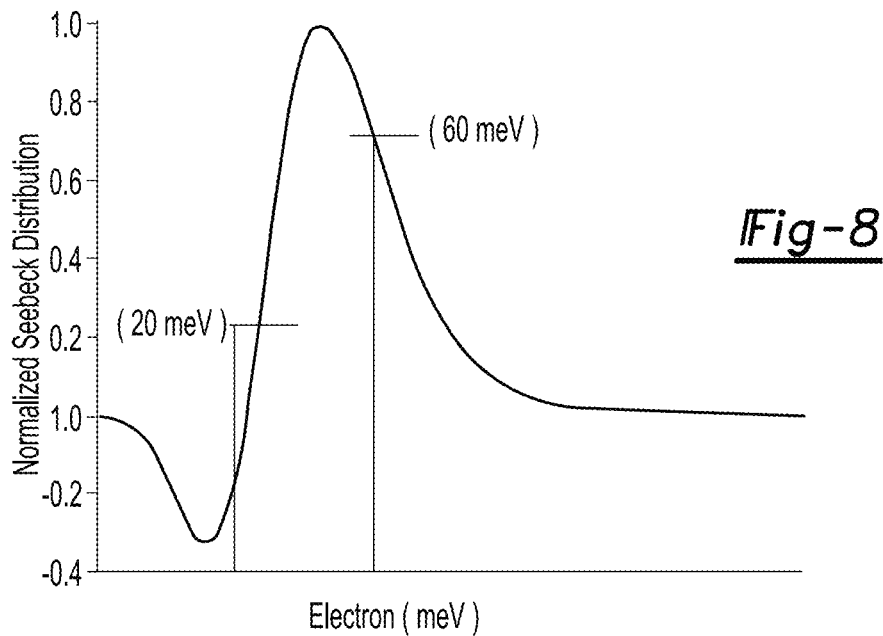
FIG. 8 is a graph illustrating calculated normalized Seebeck coefficient as a function of electron energy.

Regarding the Seebeck coefficient for a thermoelectric material, FIG. 7 illustrates a complicated relationship between the Seebeck coefficient, grain size, and grain boundary barrier height. In particular, and for bulk thermoelectric material, the highest Seebeck coefficient occurred for a grain boundary barrier height of 60 meV while for a nanocomposite thermoelectric material, the highest Seebeck coefficient was observed for a grain boundary barrier height of 20 meV. It is appreciated that the difference between the two materials and the associated Seebeck coefficient can be the result of filtering of low energy electrons within the grains of the nanocomposite thermoelectric material. In addition, FIG. 8 provides a typical normalized Seebeck coefficient distribution as a function of electron energy. As shown by this figure, a maximum value or maximum range of values for the Seebeck coefficient does not result from electron energies that are too low or too high. Stated differently, there is an intermediate value or range of values for electron energy that provides a desired Seebeck coefficient. In addition, low energy electrons pose a negative impact to the Seebeck coefficient.

Based on these figures and their teachings, it is clear that small grains with high grain boundary barrier potentials, for example $E_b=300$ meV, have the least effect on the Seebeck coefficient since such high potential barriers can filter even high energy electrons. On the other hand, FIG. 7 illustrates that the Seebeck coefficient behavior flipped or was inverted for the nanocomposite material versus the bulk material when the grain boundary barrier height was 20 meV and 60 meV, respectively. Not being bound by theory, this is postulated to be due to the Seebeck coefficient distribution being different for the two materials, and depending on the location of the peak of normalized Seebeck coefficient as shown in FIG. 8, either 20 meV or 60 meV can be more effective in increasing the Seebeck effect.

Figure 9:
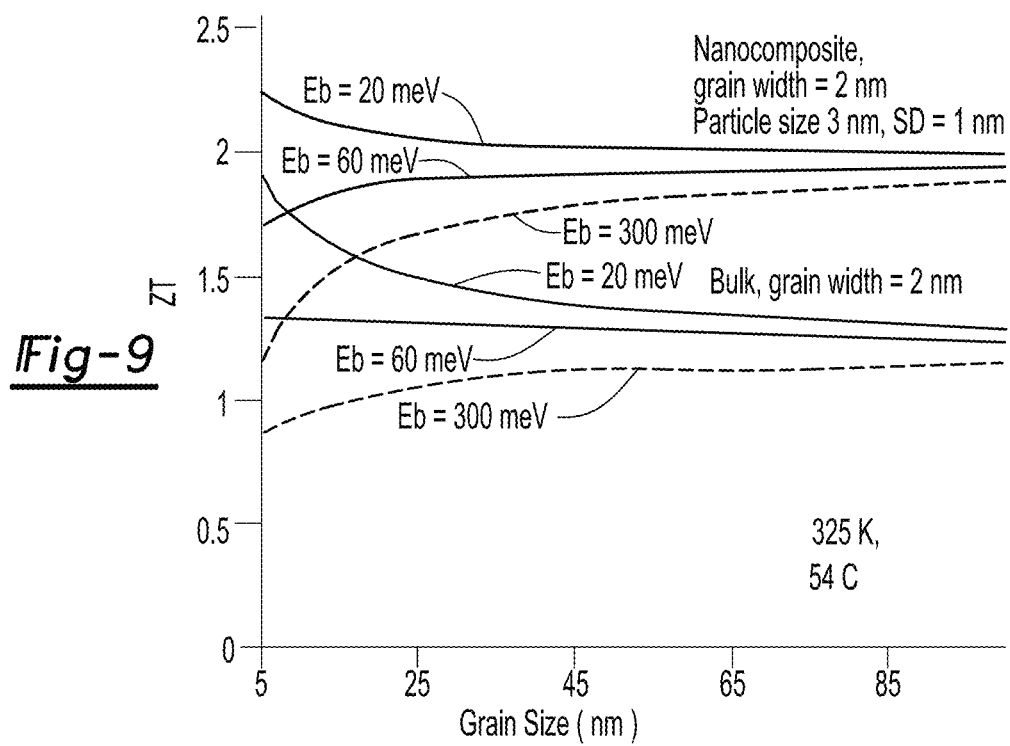
FIG. 9 is a graph illustrating effect of grain boundary properties on dimensionless figure of merit (ZT)

Regarding the dimensionless figure of merit ZT, FIG. 9 provides a comparison of ZT as a function of grain size, bulk thermoelectric material, nanocomposite thermoelectric material, and grain boundary barrier height. From this figure, it is appreciated that grain sizes below 25 nanometers can provide a dramatic improvement in the performance of bulk thermoelectric material and nanocomposite thermoelectric material. In addition, the grain boundary barrier height can significantly alter the ZT for a particular material. For example, at lower grain sizes, the ZT for the bulk and nanocomposite materials overlap, thereby suggesting that the benefit of adding second phase nanoparticles to a thermoelectric material can be diminished in cases where the grain boundary barrier potential is high due to impurities, doping, and the like.

Figure 10:
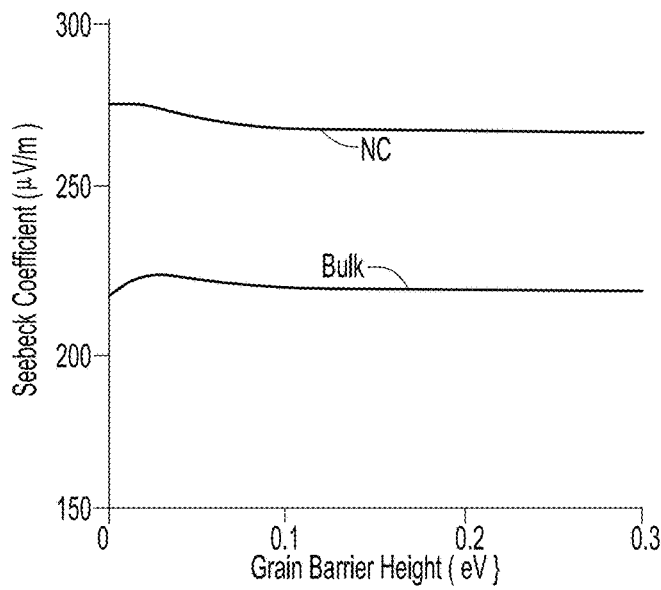
FIG. 10 is a graph illustrating Seebeck coefficient for a bulk (Bulk) and nanocomposite (NC) thermoelectric material as a function of grain boundary barrier height.
Figure 11:
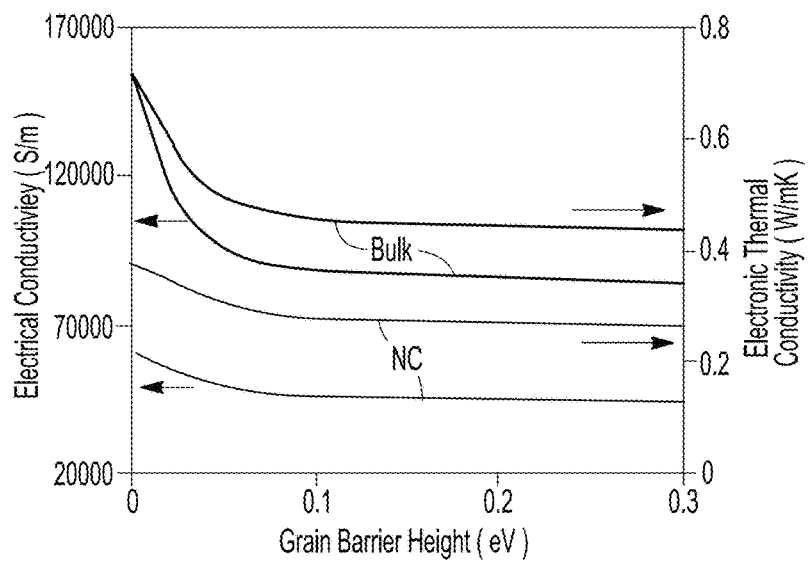
FIG. 11 is a graph illustrating electrical conductivity and electronic thermal conductivity for a bulk (Bulk) and nanocomposite (NC) thermoelectric material as a function of grain boundary barrier height.

The effect of ceramic nanoparticle inclusions within a bulk thermoelectric material on grain boundary barrier height can also be of interest with FIG. 10 illustrating a graphical representation of Seebeck coefficient as a function of grain boundary barrier height for a bulk thermoelectric material (Bulk) and a nanocomposite thermoelectric material (NC). As shown in FIG. 10, and for which a grain size of 30 nm was assumed, smaller grain boundary barrier heights are preferred with potentials over 100 meV virtually having no effect on the Seebeck coefficient of the material. In addition, FIG. 11 shows or illustrates the same behavior with respect to electrical conductivity and electronic thermal conductivity and FIG. 12 provides a graph illustrating the effect of grain boundary barrier height on ZT for bulk thermoelectric material and nanocomposite thermoelectric material.

Figure 12:
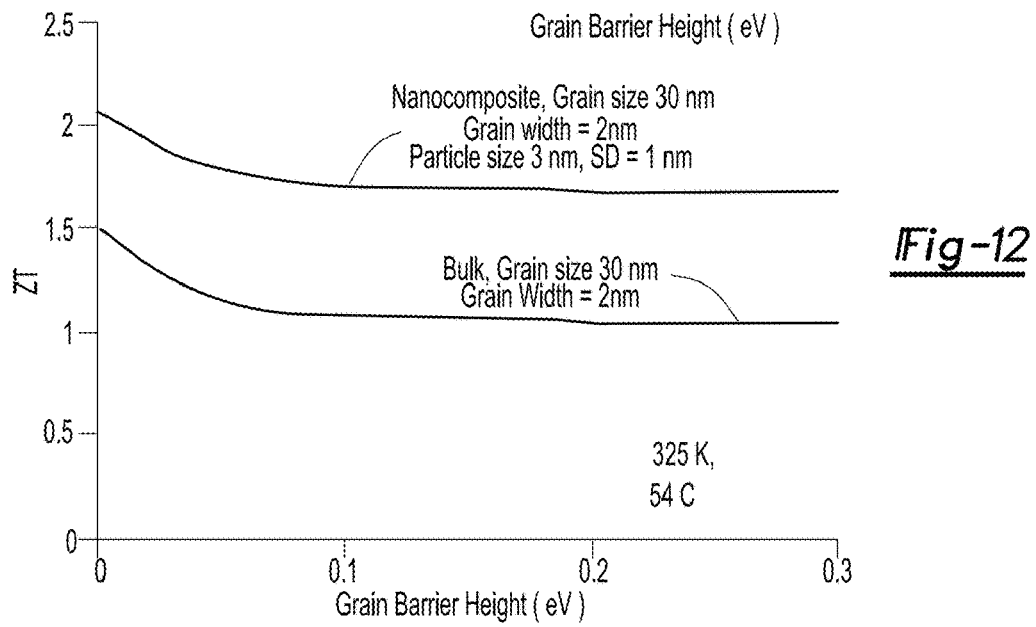
FIG. 12 is a graph illustrating ZT as a function of grain boundary barrier height.

It is appreciated that FIG. 12 could lead to the conclusion that lower grain boundary barrier heights are desired in all cases in order to achieve an increase in ZT for any thermoelectric material. However, such a conclusion can be false, for example when the grain size is also considered as discussed above in relation to FIG. 9.

Figure 13:
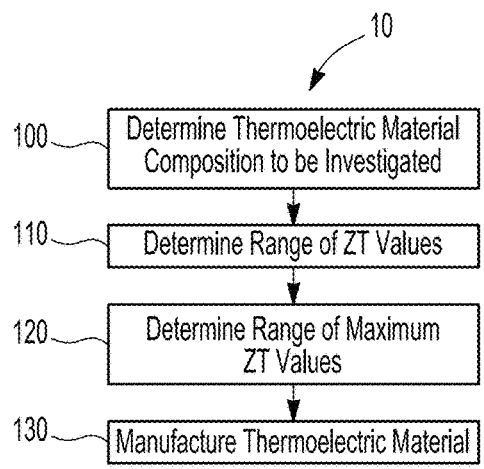
FIG. 13 is a flowchart for a process according to an embodiment of the present invention.

Turning now to FIG. 13, a process for manufacturing a thermoelectric material is shown generally at reference numeral 10. The process 10 includes determining a thermoelectric material composition to be investigated at step 100, followed by determining a range of ZT values for the thermoelectric material composition at step 110. Given the range of determined ZT values determined at step 110, step 120 determines a range of maximum ZT values and a thermoelectric material is manufactured at step 130.

Figure 14:
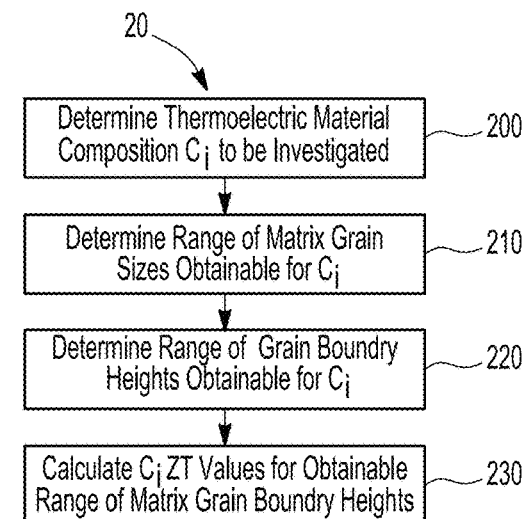
FIG. 14 is a flowchart for a process according to an embodiment of the present invention.

FIG. 14 illustrates a flowchart for a process according to another embodiment of the invention at reference numeral 20. The process 20 includes determining a thermoelectric material composition ($C_i$) to be investigated at step 200, followed by determining a range of matrix grain sizes that are obtainable for $C_i$ at step 210 and determining a range of grain boundary barrier energy heights obtainable for $C_i$ using current state of the art manufacturing techniques at step 220. The determined thermoelectric material composition may or may not include inter-grain phonon scattering particles. In addition, step 210 or step 220 may or may not include determining a range of particle sizes obtainable for inter-grain phonon scattering particles using current state of the art manufacturing techniques.

At step 230, ZT values are calculated for $C_i$ as a function of the obtainable range of matrix grain sizes and obtainable range of grain boundary heights that were determined in steps 210 and 220. Thereafter, a matrix grain size and grain boundary height is selected as a function of the calculated ZT values for $C_i$ at step 240. In some instances, step 240 can include selecting a desired average grain size for the matrix phase and a desired particle size for inter-grain phonon scattering particles as a function of the calculated ZT values. Finally, a thermoelectric material is manufactured at step 250, the thermoelectric material having the composition $C_i$ from step 200, the selected matrix grain size, grain boundary height and/or inter-grain phonon scattering particles with an average particle size that is equivalent to the desired particle size for the inter-grain phonon scattering second phase from step 240. For the purposes of the present invention, the term equivalent is defined to be within 10%, i.e. the average particle size of the inter-grain phonon scattering particles is within +/−10% of the desired particle size.

Figure 15:
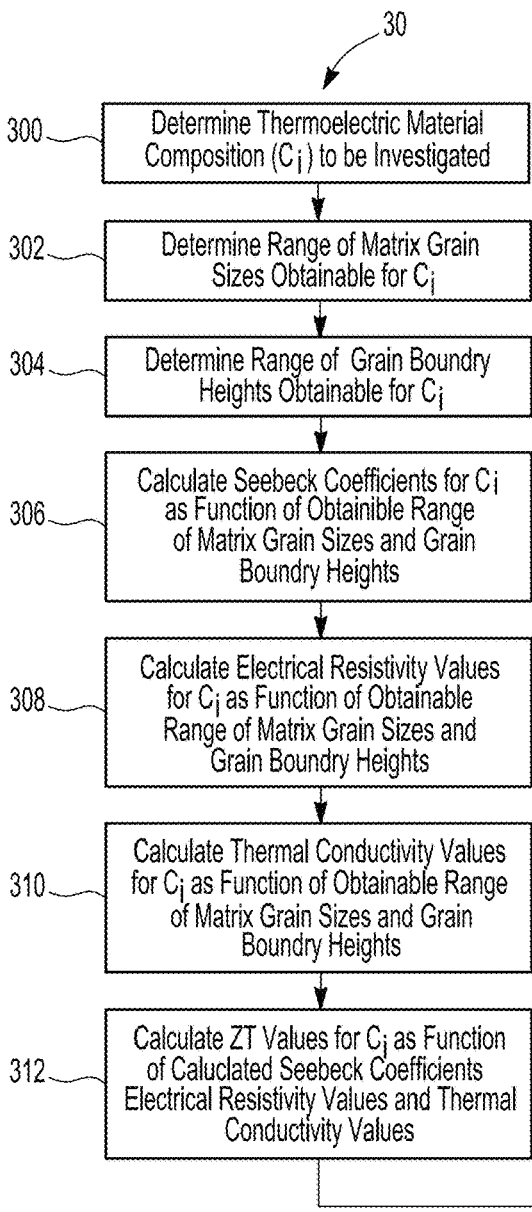
FIG. 15 is a flowchart for a process according to an embodiment of the present invention.
Figure 15:
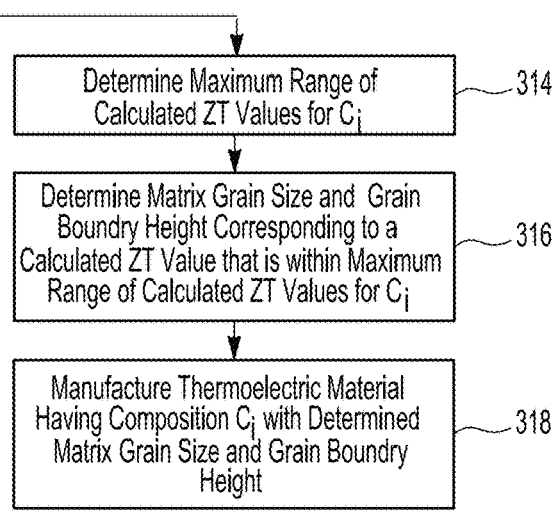

Another flowchart illustrating a process according to another embodiment of the present invention is shown generally at reference numeral 30 in FIG. 15. The process 30 includes determining a thermoelectric material composition ($C_i$) to be investigated at step 300 followed by determining a range of matrix grain sizes and a range of grain boundary heights that are obtainable for a thermoelectric material having composition $C_i$ at steps 302 and 304, respectively. It is appreciated that the composition $C_i$ can include a solid solution material, i.e. a material having a relatively uniform composition without the addition of second phase particles, second phase precipitates, and the like. In the alternative, the composition $C_i$ can be a precipitation type material such as a precipitation type alloy in which second phase precipitates/particles are formed within the alloy/material during processing. In another alternative, the composition $C_i$ can be a composite type material in which second phase particles are present and/or added to a matrix material. The matrix material can be a metal, alloy, semiconductor, ceramic, e.g. an oxide, nitride, etc., and the like. Also, the second phase particles can be a metal, alloy, semiconductor, ceramic, e.g. an oxide, nitride, etc., and the like.

The process 30 also includes calculating Seebeck coefficients for the $C_i$ composition as a function of the obtainable range of matrix grain sizes and obtainable grain boundary heights at step 306. At step 308, the process 30 includes calculating electrical resistivity values for $C_i$ as a function of the obtainable range of matrix grain sizes and grain boundary heights. At step 310, the calculation of thermal conductivity values for $C_i$ as a function of the obtainable range of matrix grain sizes and grain boundary heights is performed. Next, the calculation of ZT values for $C_i$ as a function of the calculated Seebeck coefficients, electrical resistivity values, and thermal conductivity values is performed at step 312.

Once the ZT values have been calculated, a maximum range of the calculated ZT values for $C_i$ is determined at step 314 and step 316 includes determining a matrix grain size and a grain boundary height that is within the maximum determined range from step 314. At step 318, a thermoelectric material having the composition $C_i$ is manufactured, the material having the determined matrix grain size and grain boundary height from step 316. It is appreciated that in order to manufacture the thermoelectric material at step 318, material corresponding to the composition $C_i$ is provided and processed to produce the material.

Figure 16:
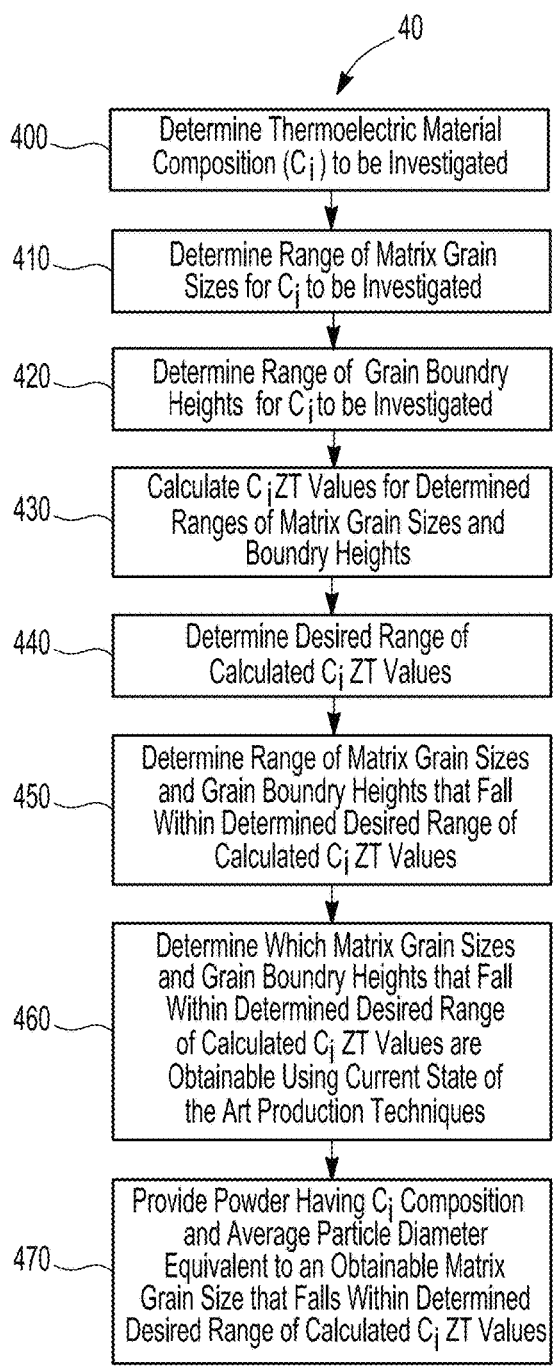
FIG. 16 is a flowchart for a process according to an embodiment of the present invention.

Referring to FIG. 16, another process according to an embodiment of the present invention is shown generally at reference numeral 40. The process 40 includes determining a thermoelectric material composition $C_i$ to be investigated at step 400, followed by determining a range of matrix grain sizes and a range of grain boundary heights for the composition $C_i$ to be investigated at steps 410 and 420, respectively. At step 430, ZT values for $C_i$ are calculated as a function of the determined ranges of matrix grain sizes and grain boundary heights from steps 410 and 420. It is appreciated that the ZT values can be calculated as a function of Seebeck coefficients, electrical resistivity values, and thermal conductivity values for $C_i$ that are also a function of the range of matrix grain sizes and grain boundary heights determined in steps 410 and 420, respectively.

A desired range of the calculated ZT values for $C_i$ is determined at step 440, e.g. a desired maximum range of the calculated ZT values can be determined. Based on the determined desired range of the calculated ZT values, the range of matrix grain sizes and grain boundary heights that fall within this range are determined at step 450. Then, matrix grain sizes and grain boundary heights that are obtainable using current state of the art production techniques and that fall within the determined desired range of calculated ZT values for $C_i$ are determined at step 460.

A powder that has the $C_i$ composition and an average particle diameter that is equivalent to an obtainable matrix grain size that falls within the grain sizes of step 460 is provided. It is appreciated that the powder can be a homogeneous powder, i.e. a powder made of individual powder particles that have a generally uniform composition with each other or, in the alternative, a non-homogeneous composition, i.e. the powders being made from first component powder particles and second component powder particles. As stated above, the first component powder particles can be in the form of be a metal, alloy, semiconductor, ceramic, e.g.

an oxide, nitride, etc., and the like. Also, the second component particles can be in the form be a metal, alloy, semiconductor, ceramic, e.g. an oxide, nitride, etc., and the like. In addition, third component particles, fourth component particles, etc. can be included in the powder having the $C_i$ composition at step 470, the third, fourth, etc. particles being of the form of be a metal, alloy, semiconductor, ceramic, e.g. an oxide, nitride, etc., and the like. Also, the powders, particles, etc., may or may not be in the form of nanoparticles such a nano-spheres, nano-rods, nano-discs nano-ellipsoids, and the like.

Figure 17:
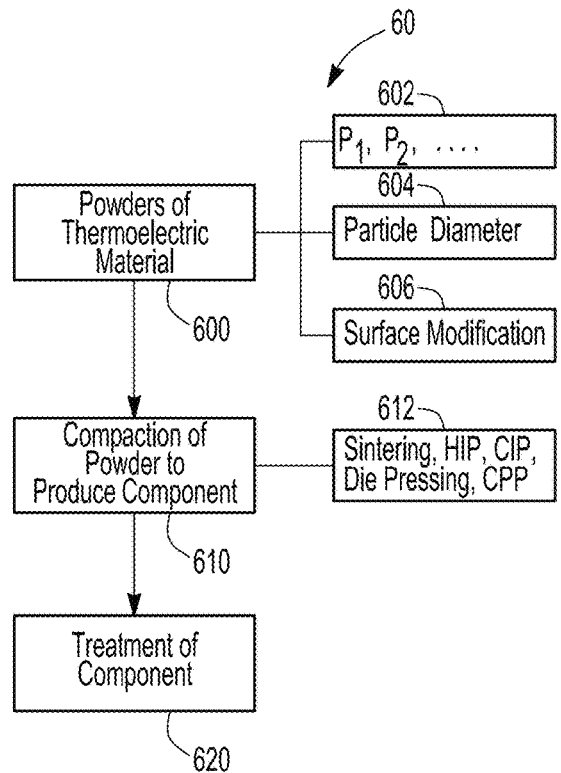
FIG. 17 is a flowchart for a process according to an embodiment of the present invention.

The powder having the $C_i$ composition is processed to produce a component. For example, a process for processing the powders is shown in FIG. 17 at reference numeral 60. The process 60 includes taking or obtaining the powders of the thermoelectric material at step 600, the powders having desired chemical and/or physical properties/characteristics. For example, the powders can include a mixture of first component particles $P_1$, second component particles $P_2$, etc. as shown at 602. In addition, the powders can have a desired particle diameter or desired particle size as shown at step 604 and/or a desired surface modification as shown at step 606. It is appreciated that the desired particle diameter is determined from a process disclosed herein, e.g. the processes illustrated in FIGS. 13-16.

It is also appreciated that the particle diameter of the first component particles $P_1$ can be the same or different than the particle diameter of the second component particles $P_2$. Finally, it is appreciated that the terms "particle diameter" and "matrix grain size" refer to an average particle diameter and average matrix grain size, respectively, as is known to those skilled in the art. The variation in particle diameters and matrix grain sizes can have a half width at half maximum height (HWHM) to modal diameter ratio between 0.4-0.6 for a differential distribution as is known to those skilled in the art. In other instances, the HWHM/modal diameter ratio is between 0.3-0.4 or, in the alternative, between 0.2-0.3. In the alternative, the HWHM/modal diameter ratio is between 0.6-0.7 or, in the alternative, between 0.7-0.8.

The process 60 further includes compaction of powders to produce a thermoelectric component at step 610. The step 610 can be a compaction by any means or method known to those skilled in the art, illustratively including sintering, hot isostatic pressing (HIP), cold isostatic pressing (CIP), die pressing, continuous particle or powder processing (CPP), etc. as shown at 612. In some instances, the component is further treated at step 620 in order to obtain a desired matrix grain size and/or desired grain boundary barrier height. For example and for illustrative purposes only, the treatment at step 620 can include a thermal treatment, a mechanical treatment, and/or a thermal-mechanical treatment. Other treatments such as exposure to electromagnetic radiation, nuclear radiation, and the like can be included.

Figure 18:
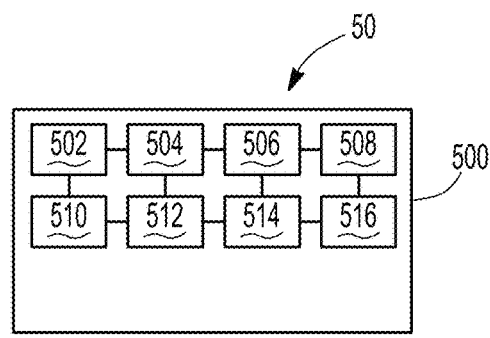
FIG. 18 is a schematic illustration of a computer with a processor according to an embodiment of the present invention.

Regarding the calculation of the various Seebeck coefficients, electrical resistivity values, thermal conductivity values, ZT values, and the like, FIG. 18 provides a schematic illustration of a computer at reference numeral 50. The computer 50 can include a CPU 500 with a plurality of components 502, 504, 506, . . . 516. For example and for illustrative purposes only, the CPU 500 can include a processor 502, memory 504, database 506, and the like. It is appreciated that the various components 502-516 are in communication with each other and with the CPU 500 as is known to those skilled in the art.

The various calculations can include algorithms with respect to Equations 1-16, assumptions, electric constants and/or physical constants known to those skilled in the art. For example, the temperature T referenced in Equation 1 can be assumed to be room temperature. In the alternative, the calculations can assume a plurality of temperatures, e.g. temperatures ranging from 0° C. to 200° C. at increments of 1° C., increments of 5° C., increments of 10° C., and the like.

In order to illustrate a sample calculation, but not limit the scope of the instant disclosure in any way, an example of a ZT calculation is provided below.

The figure of merit (ZT) for a given grain size and grain barrier height combination "j", is given by:

$$ZT = S^2 \cdot T \cdot C/(K_e + K_l) \qquad \text{Eqn 17}$$

where S is the Seebeck coefficient for the given grain size and grain boundary barrier height, C is the electrical conductivity, $K_e$ is the electron contribution to the overall thermal conductivity and $K_l$ is the phonon contribution to the overall thermal conductivity—all for the given grain size and grain boundary barrier height. It is appreciated that the index "j" for the given grain size and grain boundary energy barrier height is not shown for convenience, unless needed for clarity. Stated differently, each of the expressions discussed are for the given grain size and grain boundary energy barrier height "j".

In order to properly define S, C, $K_{ph}$ and $K_e$, a series of constants known to those skilled in the art are required and provided below. It should be appreciated that the values for the constants listed below are presented without units, as used in computer code for the calculation of ZT as a function of grain size and grain boundary energy height. However, it should also be appreciated that the units for the constants provided below would be known to one skilled in the art and be in accordance with units that afford calculation of the Seebeck coefficient in microvolts per meter (μV/m), electrical conductivity in siemens per meter (S/m) and thermal conductivity in watts per meter kelvin (W/mK).

General constants used in an example calculation include:

$\pi = 3.14$ $\kappa_B = 1.38 \times 10^{-23}$ = Boltzmann constant $h_c = 1.054 \times 10^{-34}$ = Planck's constant $e_v = 1.6 \times 10^{-19} = 1$ electron volt $e = 1.6 \times 10^{-19}$ = electron charge $m_e = 9.1 \times 10^{-31}$ = electron effective mass $\varepsilon_0 = 8.85 \times 10^{-12}$ = permittivity of air $$e_1 = 69.8 \cdot \varepsilon_o \cdot 4\pi = \text{high frequency dielectric constant} \qquad \text{Eqn 18}$$

$$e_0 = 400 \cdot \varepsilon_o \cdot 4\pi = \text{static dielectric constant} \qquad \text{Eqn 19}$$

Also, density of states constants and expressions related to effective mass include:

$N_v = 12$ = number of valleys in the electron bandstructure $$E_g = 0.13 \cdot e_v - 1.08 \times 10^{-4} \cdot T \cdot e_v = \text{electron bandgap} \qquad \text{Eqn 20}$$

$$\beta_L = E_g/(k_B T) = \text{bandgap in } k_B T \qquad \text{Eqn 21}$$

$$\beta = k_B T/E_g = \text{inverse of bandgap in } k_B T \qquad \text{Eqn 22}$$

$$e_g = E_g/e_v = \text{bandgap in electron volt} \qquad \text{Eqn 23}$$

$$m_{h1} = 0.0308 \cdot m_e = \text{hole effective mass} \qquad \text{Eqn 24}$$

$m_{h2}=0.441 \cdot m_e$=hole effective mass (Eqn 25)

$m_{h3}=0.0862 \cdot m_e$=hole effective mass (Eqn 26)

$m_{e1}=0.0213 \cdot m_e$=electron effective mass (Eqn 27)

$m_{e2}=0.319 \cdot m_e$=electron effective mass (Eqn 28)

$m_{e3}=0.0813 \cdot m_e$=electron effective mass (Eqn 29)

$md_e = N_v^{2/3} \cdot (m_{e1} \cdot m_{e2} \cdot m_{e3})^{1/3}$=density of state electron effective mass (Eqn 30)

$md_{e1} = (m_{e1} \cdot m_{e2} \cdot m_{e3})^{1/3}$=density of state electron effective mass (Eqn 31)

$md_h = N_v^{2/3} \cdot (m_{e1} \cdot m_{e2} \cdot m_{e3})^{1/3}$=density of state hole effective mass (Eqn 32)

$md_{h1} = (m_{e1} \cdot m_{e2} \cdot m_{e3})^{1/3}$=density of state hole effective mass (Eqn 33)

$Mc_e = 3/(1/m_{e1} + 1/m_{e2} + 1/m_{e3})$=Total effective mass of electron (Eqn 34)

$Mc_h = 3/(1/m_{h1} + 1/m_{h2} + 1/m_{h3})$=Total effective mass of hole (Eqn 35)

Fermi energy expressions include:

$$zF = 1.68000000000002000000 \times 10^{-9} \cdot T^3 - 2.32525000000003000000 \times 10^{-6} \cdot T^2 + 1.18722500000002000000 \times 10^{-3} \cdot T - 2.36675820000002000000 \times 10^{-1}$$ (Eqn 36)

$E_f = zF \cdot e_v$ = Fermi energy in $e_v$ (Eqn 37)

$x_f = E_f / (k_B \cdot T)$ = Fermi energy in $k_B \cdot T$ (Eqn 38)

$F_e = (E_f - E_g/2)/(k_B \cdot T)$ = energy of electron (Eqn 39)

$F_h = -(E_g/2 + E_f)/(k_B \cdot T)$ = energy of hole (Eqn 40)

with Fermi functions:

$f_e = 1/(1 + \exp(z - F_e))$ (Eqn 41)

$d1_e = \dfrac{df_e}{dz} = \dfrac{d(1/(1 + \exp(z - F_e)))}{dz}$ (Eqn 42)

$f_h = 1/(1 + \exp(z - F_h))$ (Eqn 43)

$d1_h = \dfrac{df_h}{dz} = \dfrac{d(1/(1 + \exp(z - F_h)))}{dz}$ (Eqn 44)

and conductivity effective mass expressions:

$L1_e = \int_{-F_e}^{\infty} (z + \beta z^2)^{1.5} \dfrac{d(1/(1+\exp(z-F_e)))}{dz} dz$ (Eqn 45)

$L2_e = \int_{-F_e}^{\infty} \dfrac{(z + \beta z^2)^{1.5} \cdot \dfrac{d(1/(1+\exp(z-F_e)))}{dz}}{(1+2\beta z)} dz$ (Eqn 46)

$L1_h = \int_{-F_h}^{\infty} (z + \beta z^2)^{1.5} \cdot \dfrac{d(1/(1+\exp(z-F_h)))}{dz} dz$ (Eqn 47)

$L2_h = \int_{-F_h}^{\infty} \dfrac{(z + \beta z^2)^{1.5} \cdot \dfrac{d(1/(1+\exp(z-F_h)))}{dz}}{(1+2\beta z)} dz$ (Eqn 48)

$mc_e = Mc_e \cdot L1_e / L2_e$ = conductivity effective mass of electron (Eqn 49)

$mc_h = Mc_h \cdot L1_h / L2_h$ = conductivity effective mass of hole (Eqn 50)

Regarding scattering terms, the polar optical phonon scattering of electrons ($\tau_{poe}$) and holes ($\tau_{poh}$) can be determined from the following constants and expressions:

$\varepsilon_o = 8.85 \times 10^{-12}$=permittivity of air $e_1 = 69.8$=high frequency dielectric constant $e_0 = 400$=static dielectric constant $K_0 = 0.1 e_v$=optical phono energy $N_0 = 1/(\exp(K_0/(\kappa B \cdot T)) - 1)$=phonon Plank function (Eqn 51)

$cop_e = (4\pi \cdot \varepsilon_o \cdot h_c^2 / (3e^2 \cdot (1/e_1 - 1/e_0) \cdot N_0)) \cdot (2/(md_c \cdot K_0 \cdot (1 + K_0/E_g)))^{0.5}$ (Eqn 52)

$cpo_h = (4\pi \cdot \varepsilon_o \cdot h_c^2 / (3e^2 \cdot (1/e_1 - 1/e_0) \cdot N_0)) \cdot (2/(md_h \cdot K_0 \cdot (1 + K_0/E_g)))^{0.5}$ (Eqn 53)

$b_e = (1 + 2\beta z)/(z + \beta z^2)$ (Eqn 54)

$\tau_{z3} = 1/b_e$ (Eqn 55)

with:

$\tau_{poe} = cpo_e \cdot \tau_{z3}$=lifetime for optical phonon-electron scattering (Eqn 56)

and:

$\tau_{poh} = cpo_h \cdot \tau_{z3}$=lifetime for optical phonon-hole scattering (Eqn 57)

Deformation potential scattering of electrons ($\tau_{dae}$) and holes ($\tau_{dah}$) by acoustic phonons can be determined using the following constants and expressions:

$K_a = 1.1$=fitting constant $C_1 = 7.1 \times 10^{10}$=combination electric constant $E_{ac} = 3.5 e_v$=deformation potential for acoustic phonon (Eqn 58)

$B_a = 8\beta z(1 + \beta z) \cdot K_a / (3(1 + 2\beta z)^2)$ (Eqn 59)

$A_a = \beta z(1 - K_a)/(1 + 2\beta z)$ (Eqn 60)

$Cda_e = 2\pi h_c^4 \cdot C_1 / (E_{ac}^2 \cdot (2 \cdot md_c \cdot \kappa_B \cdot T)^{1.5})$ (Eqn 61)

$Cda_h = 2\pi h_c^4 \cdot C_1 / (E_{ac}^2 \cdot (2 \cdot md_h \cdot \kappa_B \cdot T)^{1.5})$ (Eqn 62)

$\tau_{z1} = 1/(((z + \beta z^2)^{0.5}) \cdot (1 + 2\beta z) \cdot ((1 - A_a)^2 - B_a))$ (Eqn 63)

with:

$\tau_{dae} = Cda_e \cdot \tau_{z1}$=lifetime for acoustic phonon-electron scattering (Eqn 64)

and:

$\tau_{dah}=Cda_h\cdot\tau_{z1}$=lifetime for acoustic phonon-hole scattering  Eqn 65

Deformation potential scattering of electrons ($\tau_{doe}$) and holes ($\tau_{doh}$) by optical phonons can be determined using the following constants and expressions:

$r_{ho}=7.86\times10^3$=density $a=10.45\times10^{-10}$=lattice constant $K_0=1.1$=fitting constant $E_{oc}=60e_v$=deformation potential for optical phonon  Eqn 66

$B_o=8\beta z(1+\beta z)\cdot K_o/(3(1+2\beta z)^2)$  Eqn 67

$A_o=\beta z(1-K_o)/(1+2\beta z)$  Eqn 68

$Cdo_e=2h_c^2\cdot a^2\cdot K_0^2\cdot r_{ho}/(\pi E_{oc}^2\cdot(2\cdot md_e\cdot\kappa_B\cdot T)^{1.5})$  Eqn 69

$Cdo_h=2h_c^2\cdot a^2\cdot K_0^2\cdot r_{ho}/(\pi E_{oc}^2\cdot(2\cdot md_h\cdot\kappa_B\cdot T)^{1.5})$  Eqn 70

$\tau_{z2}=1/(((z+\beta z^2)^{0.5})\cdot(1+2\beta z)\cdot((1-A_o)^2-B_o))$  Eqn 71 with:

$\tau_{doe}=Cdo_e\cdot\tau_{z2}$=lifetime for deformation potential-electron scattering  Eqn 72 and:

$\tau_{doh}=Cdo_h\cdot\tau_{z2}$=lifetime for deformation potential-hole scattering  Eqn 73

In the event that the thermoelectric material includes nanoparticles, the scattering of elections ($\tau_{ie}$) and holes ($\tau_{ih}$) by the nanoparticles can be determined using the following constants and expressions:

$\lambda_e$ = Real Portion of:  Eqn 74
$\{(((2e^2\cdot(2\cdot md_e)^{1.5}/(e_0\pi\cdot h_c^3))\cdot(k_BT)^{0.5}\cdot(F_e+F_e^2\beta)^{0.5}\cdot$
$(1+2F_e\beta))^{-0.5})/10^{-9}\}$ $\lambda_h$ = Real Portion of:  Eqn 75
$\{(((2e^2\cdot(2\cdot md_h)^{1.5}/(e_0\pi\cdot h_c^3))\cdot(k_BT)^{0.5}\cdot(F_h+F_h^2\beta)^{0.5}\cdot$
$(1+2F_h\beta))^{-0.5})/10^{-9}\}$ $WF = 300$ = work function of an inclusion, e.g. a ceramic inclusion $EE = 4.76$ = electron affinity of host material $Vb_e = WF - EE + F_e\cdot(k_BT)/e_v$  Eqn 76

$Vb_h = WF - EE + F_h\cdot(k_BT)/e_v$  Eqn 77

$W_e = Vb_e\cdot R/\exp(-R/\lambda_e)$  Eqn 78

$W_h = Vb_h\cdot R/\exp(-R/\lambda_h)$  Eqn 79

$W = 10$ = fitting constant $U = 0.3$ = volume % of nanoparticles $R = 1.5$ = radius of nanoparticles in nm $Vr_e = W_e\cdot(1/1)\cdot\exp(-1/\lambda_e)\cdot e_v;\ V_e = Vr_e/e_v$  Eqn 80

$Vr_h = W_h\cdot(1/1)\cdot\exp(-1/\lambda_h)\cdot e_v;\ V_h = Vr_h/e_v$  Eqn 81

$a_e = \int\int_{R,0}^{\infty,W}\left(q\cdot\sin\left(\frac{1t}{R}\right)v_{re}\right)dl\,dt$  Eqn 82

$\alpha_e = (1/R^4)\cdot a_e$  Eqn 83

$a_h = \int\int_{R,0}^{\infty,W}\left(1\cdot\sin\left(\frac{1t}{R}\right)v_{rh}\right)dl\,dt$  Eqn 84

$\alpha_h = (1/R^4)\cdot a_h$  Eqn 85 with:

$\tau_{ie}=(\kappa_BT)^{1.5}\cdot(z^{1.5}\cdot(1+\beta z)^{1.5}\cdot 4R\cdot(2md_{e1})^{0.5})/$
$((1+2\beta z)\cdot U\cdot 3\lambda_e)$=lifetime for nanoparticles-electron scattering  Eqn 86 and:

$\tau_{ih}=(\kappa_BT)^{1.5}\cdot(z^{1.5}\cdot(1+\beta z)^{1.5}\cdot 4R\cdot(2md_{h1})^{0.5})/$
$((1+2\beta z)\cdot U\cdot 3\lambda_h)$=lifetime for nanoparticles-electron scattering  Eqn 87

Grain boundaries can naturally be a source of scattering, and the scattering of electrons ($\tau_{be2}$) and holes ($\tau_{bh2}$) can be determined using the following constants and expressions:

$e_b=0.3$(values range from 0.003-0.3 with 0.3 corresponding to a very strong electrical conductivity)=Barrier height $d_1=30$=grain boundary constant $E_b=-e_b\cdot e_v$=grain boundary barrier energy height='$E_b$' in FIG. 3  Eqn 88

$DL=d_1\cdot 10^{-9}$=grain size='$L$' in FIG. 3  Eqn 89

$Gw=5\times10^{-9}$=grain boundary width='$W$'=FIG. 3

$E=\kappa_BTz$  Eqn 90

$GN=4(E/E_b)\cdot(1-E/E_b)$  Eqn 91

$GD_e=((2md_e\cdot E_b\cdot Gw^2/h_c^2)\cdot(1-E/E_b))^{0.5}$  Eqn 92

$Z_e=(\exp(GD_e)-\exp(-GD_e))/2$  Eqn 93

$Z_{e1}=GD_e$  Eqn 94 with:

$\tau_{be2}=DL\cdot(md_e/(2\cdot E))^{0.5}\cdot(1+GN/(Z_{e1})^2)$=lifetime for grain boundary-electron scattering  Eqn 95 and:

$GN=4\cdot(E/E_b)\cdot(1-E/E_b)$  Eqn 96

$GD_h=((2\cdot md_h\cdot E_b\cdot Gw^2/h_c^2)\cdot(1-E/E_b))^{0.5}$  Eqn 97

$Z_h=(\exp(GD_h)-\exp(-GD_h))/2$  Eqn 98

$Z_{h1}=GD_h$  Eqn 99 with:

$\tau_{bh2}=DL\cdot(md_h/(2E))^{0.5}\cdot(1+GN/(Z_{h1})^2)$=lifetime for grain boundary-hole scattering  Eqn 100

Though not required, interfacial surface roughness scattering of an inclusion particle can be considered with such scattering of electrons ($\tau_{ifre}$) and holes ($\tau_{ifrh}$) determined by the following constants and expressions:

$d = 1 =$ roughness height in nm $c_1 = 2.4 =$ correlation length in nm $$\lambda = c_1 \times 10^{-9} \quad \text{Eqn 101}$$

$$\delta = d \times 10^{-9} \quad \text{Eqn 102}$$

$$\varepsilon_0 = 8.85 \times 10^{-12}$$

For holes:

$h_{WL} = 11.4 \times 10^{-9} =$ hole constant $Ns_h = 10^{18} =$ carrier concentration $$k_h = 2\pi / h_{WL} = \text{counting constant for phonon energy} \quad \text{Eqn 103}$$

$$K_h = 2k_h \quad \text{Eqn 104}$$

$\varepsilon_s = 400 =$ high frequency dielectric constant $$b_h = (6*2md_h \cdot e^2 \cdot Ns_h / (h_c^2 \lambda \varepsilon_s \cdot \varepsilon_o))^{0.333} \quad \text{Eqn 105}$$

$$fz_h = (0.5 \cdot b_h^3 \cdot z^2)^{0.5} \cdot \exp(-0.5 b_h z) \quad \text{Eqn 106}$$

$$fzq_h = (0.5 \cdot b_h^3 \cdot z_q^2)^{0.5} \cdot \exp(-0.5 b_h z_q) \quad \text{Eqn 107}$$

$$Fq_h = \int\int_{0,0}^{10^9,10^9} ((fz_h^2 \cdot \exp(-z \cdot q) \cdot fzq_h^2 \cdot \exp(z_q q) dz \cdot dz_q \quad \text{Eqn 108}$$

$$qs_h = (e^2 \cdot md_h / (h_c^2 \cdot 2\pi \cdot \varepsilon_s \cdot \varepsilon_o)) \cdot Fq_h \quad \text{Eqn 109}$$

$$J_h = \int_0^{K_h} \frac{(-q^2 \lambda^4 / 4) \cdot q^4}{2k_h^3 (q + qs_h)^2 \sqrt{\left(1 - \left(\frac{q}{2k_h}\right)\right)^2}} dq \quad \text{Eqn 110}$$

$$w_{ifrh} = \left((e^2 \cdot Ns_h \cdot \delta \cdot \lambda / (2\varepsilon_s \cdot \varepsilon_o)\right)^2 \cdot md_h \cdot J_h / h_c^3) \quad \text{Eqn 111}$$

$\tau_{ifrh} = 1/wifr_h =$ lifetime for roughness-hole scattering $\quad$ Eqn 112 and for electrons:

$e_{WL} = 11.4 \times 10^{-9} =$ electron constant $Ns_e = 10^{18} =$ carrier concentration $$k_e = 2\pi / e_{WL} \quad \text{Eqn 113}$$

$$K_e = 2k_e \quad \text{Eqn 114}$$

$\varepsilon_s = 400 =$ high frequency dielectric constant $$b_e = (6 \cdot 2md_e \cdot e^2 \cdot Ns_e / (h_c^2 \cdot \varepsilon_s \cdot \varepsilon_o))^{0.333} \quad \text{Eqn 115}$$

$$fz_e = (0.5 \cdot b_e^3 \cdot z^2)^{0.5} \cdot \exp(-0.5 b_e z) \quad \text{Eqn 116}$$

$$fzq_e = (0.5 \cdot b_e^3 \cdot z_q^2)^{0.5} \cdot \exp(-0.5 b_e z_q) \quad \text{Eqn 117}$$

$$Fq_e = \int\int_{0,0}^{10^9,10^9} ((fz_e^2 \cdot \exp(-z \cdot q) \cdot fzq_e^2 \cdot \exp(z_q q) dz \cdot dz_q \quad \text{Eqn 118}$$

$$qs_e = (e^2 \cdot md_e / (h_c^2 \cdot 2\pi \cdot \varepsilon_s \cdot \varepsilon_o)) \cdot Fq_e \quad \text{Eqn 119}$$

$$J_e = \int_0^{K_e} \frac{\exp(-q^2 \lambda^4 / 4) \cdot q^4}{2k_e^3 (q + qs_e)^2 \sqrt{\left(1 - \left(\frac{q}{2k_e}\right)\right)^2}} dq \quad \text{Eqn 120}$$

$$w_{ifre} = \left((e^2 \cdot Ns_e \cdot \delta \cdot \lambda / (2\varepsilon_s \cdot \varepsilon_o)\right)^2 \cdot md_e \cdot J_e / h_c^3) \quad \text{Eqn 121}$$

$\tau_{ifre} = 1/w_{ifre} =$ lifetime for roughness-electron scattering $\quad$ Eqn 122

Thus the total scattering for electrons ($\tau_{ze}$) and holes ($\tau_{zh}$) can be obtained from:

$$\tau_{ze} = 1/(1/\tau_{doe} + 1/\tau_{dae} + 1/\tau_{poe} + 1/\tau_{be2} + 1/\Gamma_{ie} + 1/\tau_{ifre}) = \text{total lifetime for electron scattering} \quad \text{Eqn 123}$$

$$\tau_{zh} = 1/(1/\tau_{doh} + 1/\tau_{dah} + 1/\tau_{poh} + 1/\tau_{bh2} + 1/\Gamma_{ie} + 1/\tau_{ifrh}) = \text{total lifetime for hole scattering} \quad \text{Eqn 124}$$

Once the scattering terms have been determined, electrical conductivity ($C_e$, $C_h$), Seebeck coefficient ($S_e$, $S_h$) can be determined for the given grain size and grain boundary energy barrier height using the following expressions. In particular, $C_e$ and $C_h$ can be determined from:

$$c_e = (e^2 / (3\pi^2 \cdot h_c^3 \cdot m_{ce})) \cdot (2 \cdot m_{de} k_B T)^{1.5} \quad \text{Eqn 125}$$

$$C_e = c_e \cdot \int_{-F_e}^{\infty} \frac{(z + \beta z^2)^{1.5} \cdot \tau_{ze} \cdot \frac{d(1/(1 + \exp(z - F_e))}{dz}}{(1 + 2\beta z^2)} dz \quad \text{Eqn 126}$$

$$c_h = (e^2 / (3\pi^2 \cdot h_c^3 \cdot m_{ch})) \cdot (2 \cdot m_{dh} k_B T)^{1.5} \quad \text{Eqn 127}$$

$$C_h = c_h \cdot \int_{-F_h}^{\infty} \frac{(z + \beta z^2)^{1.5} \cdot \tau_{zh} \cdot \frac{d(1/(1 + \exp(z - F_h))}{dz}}{(1 + 2\beta z)} dz \quad \text{Eqn 128}$$

and the total electrical conductivity (C) is simply:

$$C = (C_e + C_h) \quad \text{Eqn 129}$$

Also, $S_e$ and $S_h$ can be determined by:

$$S_e = -(k_B / e) \cdot \frac{\int_{F_e}^{\infty} \frac{(z + \beta z^2)^{1.5} \cdot \tau_{ze} \cdot d\left(\frac{1}{1 + \exp(z - F_e)}\right)}{dz} \cdot (z - F_e)}{\int_{-F_e}^{\infty} \frac{(z + \beta z^2)^{1.5} \cdot \tau_{ze} \cdot d\left(\frac{1}{1 + \exp(z - F_e)}\right)}{(1 + 2\beta z)} dz} \quad \text{Eqn 130}$$

$$S_h = -(k_B / e) \cdot \frac{\int_{F_h}^{\infty} \frac{(z + \beta z^2)^{1.5} \cdot \tau_{zh} \cdot \frac{d(1/(1 + \exp(z - F_h))}{dz} \cdot (F_h - z)}{(1 + 2\beta z)} dz}{\int_{-F_h}^{\infty} \frac{(z + \beta z^2)^{1.5} \cdot \tau_{zh} \cdot \frac{d(1/(1 + \exp(z - F_h))}{dz}}{(1 + 2\beta z)} dz} \quad \text{Eqn 131}$$

and the total Seebeck coefficient (S) is simply:

$$S = (S_e \cdot C_e + S_h \cdot C_h)/C \quad \text{Eqn 132}$$

It is appreciated that the power factor (P) is given by:

$$P = S^2 \cdot C \quad \text{Eqn 133}$$

Also, it should be appreciated that the preceding constants and expressions afford for the calculation of electrical conductivity and Seebeck coefficient as a function of grain size, grain boundary width and/or grain boundary barrier height. Naturally, certain constants would be assumed and varied as needed. For example, the temperature (T) for the calculations used to produce FIGS. 3 and 7 was 300° C., however, the temperature could be varied to determine the effect of temperature on C and S. Also, the size/radius, volume percent, fitting constants, etc., of any inclusions, nanoparticles, etc., can be varied to determine their effect on calculated results.

Regarding thermal conductivity of the material, it is appreciate that additional expressions and scattering terms are needed. For example, Lorentz numbers for electrons ($L_e$) and holes ($L_h$) are useful and can be obtained from the following expressions:

$$L_e = \qquad \text{Eqn 134}$$

$$\left(\left(\frac{C_e}{C}\int_{-F_e}^{\infty}\frac{(z+\beta z^2)^{1.5}\cdot \tau_{ze}\cdot z^2 \cdot \frac{d\left(\frac{1}{1+\exp(z-F_e)}\right)}{dz}}{(1+2\beta z)}dz\right)\middle/\left(\int_{-F_e}^{\infty}\frac{(z+\beta z^2)^{1.5}\cdot \tau_{ze}\cdot \frac{d\left(\frac{1}{1+\exp(z-F_e)}\right)}{dz}}{(1+2\beta z)}dz\right)\right)^2 - \left(\frac{\int_{-F_e}^{\infty}\frac{(z+\beta z^2)^{1.5}\cdot t_{ze}\cdot z\cdot \frac{d(1/(1+\exp(z-F_e)))}{dz}}{(1+2\beta z)}dz}{\int_{-F_e}^{\infty}\frac{(z+\beta z^2)^{1.5}\cdot \tau_{ze}\cdot \frac{d(1/(1+\exp(z-F_e)))}{dz}}{(1+2\beta z)}dz}\right)$$

and $$L_h = \qquad \text{Eqn 135}$$

$$\left(\left(\frac{C_h}{C}\int_{-F_h}^{\infty}\frac{(z+\beta z^2)^{1.5}\cdot \tau_{zh}\cdot z^2 \cdot \frac{d\left(\frac{1}{1+\exp(z-F_e)}\right)}{dz}}{(1+2\beta z)}dz\right)\middle/\left(\int_{-F_h}^{\infty}\frac{(z+\beta z^2)^{1.5}\cdot \tau_{zh}\cdot \frac{d\left(\frac{1}{1+\exp(z-F_e)}\right)}{dz}}{(1+2\beta z)}dz\right)\right)^2 - \left(\frac{\int_{-F_h}^{\infty}\frac{(z+\beta z^2)^{1.5}\cdot t_{zh}\cdot z\cdot \frac{d(1/(1+\exp(z-F_e)))}{dz}}{(1+2\beta z)}dz}{\int_{-F_h}^{\infty}\frac{(z+\beta z^2)^{1.5}\cdot \tau_{zh}\cdot \frac{d(1/(1+\exp(z-F_e)))}{dz}}{(1+2\beta z)}dz}\right)$$

and $$L_b = (e/k_B)^2 \cdot C_e \cdot C_h \cdot (S_e - S_h)^2 / C^2 \qquad \text{Eqn 136}$$
$$= \text{bipolar Lorentz number}$$

which afford for the electronic thermal conductivity ($K_e$) to be calculated from:

$$K_e = T \cdot C \cdot (k_B^2/e^2) \cdot (L_e + L_h + L_b) \qquad \text{Eqn 137}$$

As such, the electronic thermal conductivity as a function of grain size can be calculated and plotted as shown in FIG. 5.

Regarding lattice thermal conductivity, the following constants and expressions are useful:

$$K_0 = 0.1 e_v = \text{phonon energy} \qquad \text{Eqn 138}$$

$L_{EO} = 1 \times 10^{-3} = $ grain size parameter of sample
$B_u = 10.9 \times 10^{-18} = $ Umpklamp scattering constant
$n = 5.2 = $ fitting parameter
$B_n = 42 \times 10^{-24} = $ normal scattering constant
$A = 1.9 \times 10^{-42} = $ alloy scattering constant $$E_d = 25 e_v \qquad \text{Eqn 139}$$
$v = 3000 = $ sound velocity
$\theta_d = 164.9 = $ Debye temperature $$Q = \theta_d / T \qquad \text{Eqn 140}$$
$U = 0.3 = $ volume % of particles
$r = 1.5 = $ radius of particles in nm $$A_1 = r^2/1^2 \qquad \text{Eqn 141}$$

$$B_1 = 1^2/r \qquad \text{Eqn 142}$$
$m = -0.925 = $ mass constant
$k = 0.3 = $ spring constant
$q = 80 = $ fitting *parament*

$$r_1 = (\alpha^2/4)\cdot m^2 + 3\cdot(\alpha^8)\cdot(k^2)\cdot(\sin(\alpha\cdot q\_/2))^4/((\alpha\cdot q\_/2)^4) \qquad \text{Eqn 143}$$

$$r_2 = \qquad \text{Eqn 144}$$
$$3.14\cdot(\cos(4r\cdot q) - 1 + (4r\cdot q)\cdot\sin(4r\cdot q) + 32(r\cdot q)^4 - 8(r\cdot q)^2)/(16(r\cdot q)^6)$$

$$\sigma_{\_ray} = (r\cdot q)^4 \cdot r_1 \cdot r_2 \qquad \text{Eqn 145}$$

$\alpha = 1/\sqrt{2} = $ trigonometric ratio
$q\_ = 0.1 = $ wave vector parameter $$X = \left(\sqrt{1+m}\cdot\sqrt{1+k}\right) - 1 \qquad \text{Eqn 146}$$

$$\sigma_{\_ng} = 2\cdot(1 - \sin(2\cdot r\cdot q\cdot X)/(r\cdot q\cdot X) + \qquad \text{Eqn 147}$$
$$\sin(r\cdot q\cdot X)\cdot\sin(r\cdot q\cdot X)/((r\cdot q\cdot X)^2))$$

$$\sigma_{\_total} = 1/((1/\sigma_{\_ray}) + (1/\sigma_{\_ng})) \qquad \text{Eqn 148}$$

$$\eta_1 = \frac{U(3\times 10^{27})}{4\pi\int_0^{\infty}\frac{r^3 r^{(A1-1)}\exp\left(\frac{-r}{B_1}\right)}{B_1^{A1}\Gamma(A_1)}dr} \qquad \text{Eqn 149}$$

which afford for grain boundary scattering (t_B), Umpklamp scattering (t_u), normal scattering (t_N), alloy scattering (t_A) and nanoparticle scattering (t_D) to be determined from the following expressions:

$$t_{\_B} = v/L_{EO} \qquad \text{Eqn 150}$$
$\quad = $ total lifetime for phonon and boundary scattering $$t_{\_U} = B_u\cdot s^2\cdot k_B^2\cdot T^3\cdot \exp(-\theta_d/(n\cdot T))/h_c^2 \qquad \text{Eqn 151}$$
$\quad = $ total lifetime for phonon and *UmKlapp* scattering $$t_{\_N} = B_n\cdot s^2\cdot k_B^2\cdot T^5/h_c^2 \qquad \text{Eqn 152}$$
$\quad = $ total lifetime for phonon and Normal scattering -continued $$t\_A = A \cdot s^4 \cdot k_B^4 \cdot T^4 / h_c^4 \quad \text{Eqn 153}$$
= total lifetime for phonon- and alloy scattering $$t\_D = v\eta_1(1/(\pi(A_1 \cdot B_1)^2)) \cdot (1 \times 10^{-18}) \cdot \quad \text{Eqn 154}$$
$$\int_0^\infty \pi^2 r^4 \sigma\_{total} \cdot r^{(A1-1)} \cdot \exp\frac{(-r/B_1)}{B_1^{A1}\Gamma(A_1)} dr =$$
total lifetime for phonon- and nanoparticle scattering For grain boundary scattering:

$D_L = 30 \times 10^{-9}$ = grain size $FT_1 = 0.8$ = fitting parameter $FT_2 = 10^{15}$ = fitting parameter $\epsilon = 0.1$ = fitting parameter $t_{ref} = (D_L/v) \cdot FT_1$ = total lifetime for phonon- and reflection type scattering  Eqn 155

$t_{diff} = (D_L/v) \cdot (\kappa_B \cdot \theta_d/K_0) \cdot 1/\eta$ = total lifetime for phonon- and diffraction type scattering  Eqn 156

$t_{ray} = (v/D_L)^3 \cdot (\theta_d \cdot h_c/(T \cdot K_0))^4 \cdot FT_2$ = total lifetime for phonon- and Rayleigh type scattering  Eqn 157 and $t\_Bn = 1/t_{ref} + 1/t_{diff} + 1/t_{ray}$  Eqn 158

If surface roughness scattering is to be considered, the following constants and expressions can be included in a calculation:

$n = 1$ $W_L = 3 \cdot 10^{-9}$ = grain boundary width $k = 2\pi/W_L$  Eqn 159

$dw_{AB} = 9.69 \times 10^{12}$ = used/calculated for BiTe/SiO$_2$ $h_{cw} = 0.0024 \cdot e_v$ $u_1 = 1730$ = constant for BiTe $\lambda = c_1 \cdot 10^{-9}$  Eqn 160

$\delta = d \cdot 10^{-9}$  Eqn 161

$w_{w1} = 2 = 1^{st}$ grain boundary thickness value/parameter $L_1 = w_{w1} \cdot 10^{-9}$  Eqn 162

$q_{z1} = n \cdot \pi/L_1$  Eqn 163

$w_{w2} = 5 = 2^{nd}$ grain boundary thickness value/parameter $L_2 = w_{w2} \cdot 10^{-9}$  Eqn 164

$q_{z2} = n \cdot \pi/L_2$  Eqn 165

$w_{w3} = 10 = 3^{rd}$ grain boundary thickness value/parameter $L_3 = w_{w3} \cdot 10^{-9}$  Eqn 166

$q_{z3} = n \cdot \pi/L_3$  Eqn 167

$Z_p = \int_0^{6.28}((1-\cos(\theta))(\cos(\theta))^2 \exp(-k^2\lambda^2(\sin(\theta/2))^2)d\theta$  Eqn 168

And interface roughness scattering:

$\alpha_1 = (1 - (q_{z1}^2 - k^2)/(q_{z1}^2 + k^2) \cdot \sin(2q_{z1}\delta)/(2q_{z1}\delta)) \cdot (\delta/L_1)$  Eqn 169

$\tau_{ifr\_1} = (dw_{AB})^2 \cdot (h_{cw}/h_c) \cdot \lambda^2 \cdot \alpha_1^2 \cdot Z_p/(2u_1^2)$ = lifetime for roughness and phonon scattering  Eqn 170

$t\_c = t\_U + t\_N + t\_A + t\_D + t\_Bn + \tau_{ifr\_1}$ = total lifetime of phonon scattering  Eqn 171

$t_c = 1/t\_c$  Eqn 172

$t_N = 1/t\_N$  Eqn 173 and the Lorentz numbers can be calculated from:

$$L_1 = \int_0^Q \left(t_c \cdot s^4 \cdot \frac{\exp(s)}{(\exp(s)-1)^2}\right) ds \quad \text{Eqn 174}$$

$$L_2 = \int_0^Q \left(t_c \cdot s^4 \cdot \frac{\exp(s)}{t_N(\exp(s)-1)^2}\right) ds \quad \text{Eqn 175}$$

$$L_3 = \int_0^Q (1 - t_c/t_N) \cdot s^4 \cdot \frac{\exp(s)}{t_N(\exp(s)-1)^2} ds \quad \text{Eqn 176}$$

which affords for the lattice contribution to the thermal conductivity to be determined from the following expression:

$$K_1 = (\kappa_B^4 \cdot T^3/(2\pi \cdot v \cdot h_c^3)) \cdot (L_1 + L_2^2/L_3) \quad \text{Eqn 177}$$

As such, the lattice thermal conductivity ($K_1$) can be calculated as a function of grain size and plotted as shown in FIG. 5. Furthermore, the total thermal conductivity ($K_e + K_1$) can be determined/calculated and plotted as shown in FIG. 6.

Finally, the figure of merit as a function of grain size can be determined as a function of grain size and plotted as shown in FIG. 9. Furthermore, and as shown in FIG. 9, ZT for various values of grain boundary barrier height and/or inclusion of a nanocomposite particle can be calculated and plotted.

$$ZT = S^2 \cdot T \cdot C/(K_1 + K_e) = \frac{S^2 T}{\rho(k_{el} + k_{ph})} \quad \text{Eqn 178}$$

Naturally, the calculation of ZT would be repeated for various values of matrix grain size, grain boundary barrier height, grain boundary width, nanoparticle, nanoparticle amount and/or nanoparticle size that were desired to be examined. Also, such calculations would be performed by a computer such as the one illustratively shown in FIG. 18.

In this manner, researchers can estimate which matrix grain size, grain boundary barrier height, grain boundary width, nanoparticle, nanoparticle amount and/or nanoparticle size systems are more likely to exhibit relatively high ZT values and/or which compositions or range of compositions within a particular system may provide the highest ZT values. This range of compositions with the associated high ZT values can also be compared with other material properties such as mechanical property data, chemical property data and the like, in order to choose an optimum thermoelectric material composition for a given application. As such, the process provides a valuable tool to guide experimental design of thermoelectric materials.

For example, the process disclosed herein was used to design and produce a novel thermoelectric material with an improved ZT as discussed below. In particular, the process guided utilization of phonon scattering via inclusion of nanoparticles into a thermoelectric matrix to reduce phonon thermal conductivity, and also hybridization of the matrix with grain boundary modification to improve the carrier mobility, and therein the power factor.

Figure 19:
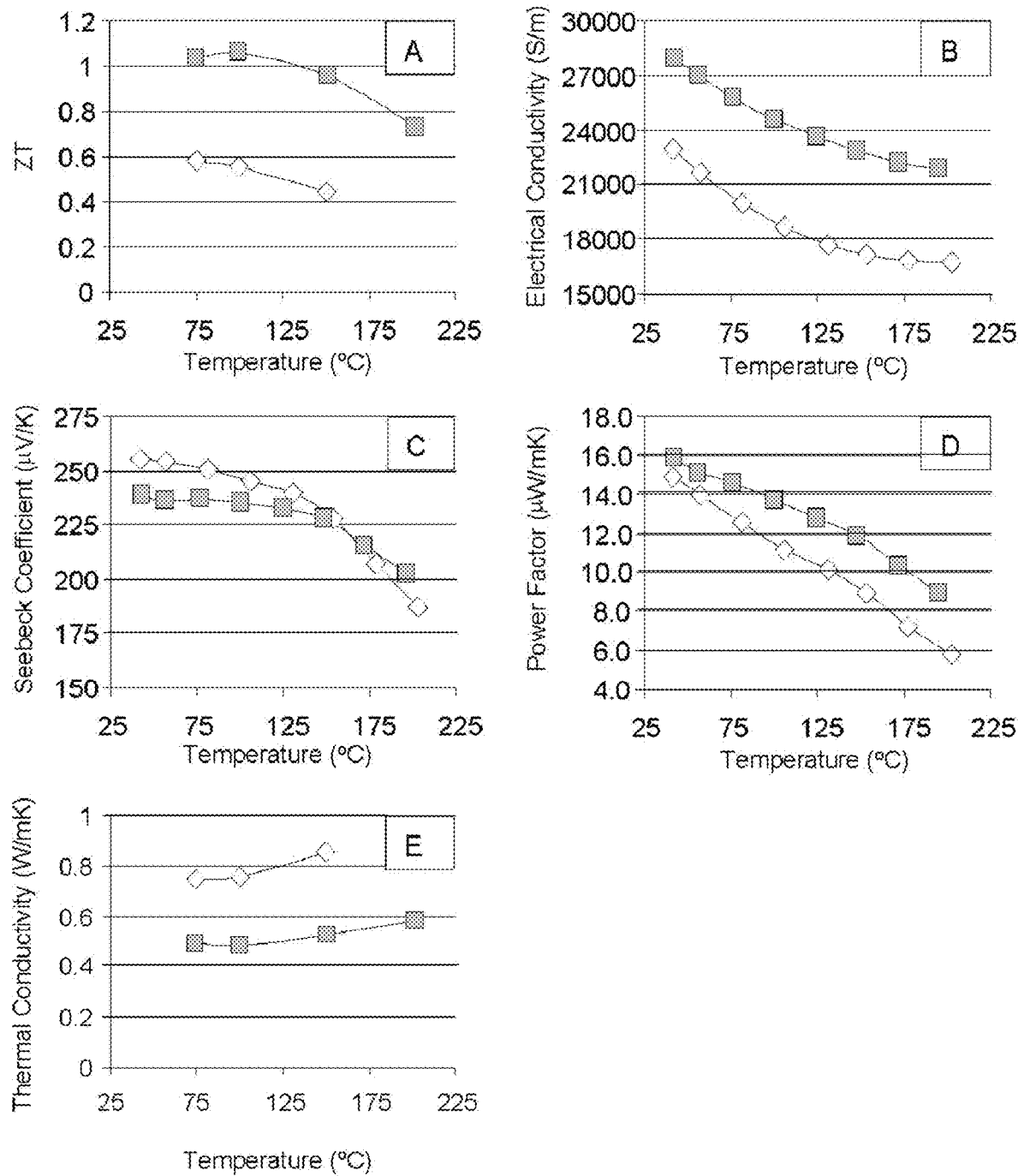
FIG. 19 is a series of graphs illustrating: (A) figure of merit ZT versus temperature for a bismuth antimony telluride matrix with zinc oxide nanoparticles and zinc antimony modified grain boundaries (BAZT—filled square data points) and a bismuth antimony telluride matrix with no zinc oxide nanoparticles or modified grain boundaries (BAT—open square data points); (B) electrical conductivity versus temperature for the BAZT and BAT materials; (C) Seebeck coefficient versus temperature for the BAZT and BAT materials; (D) power factor versus temperature for the BAZT and BAT materials; and (E) thermal conductivity versus temperature for the BAZT and BAT materials.

A unique nanocomposite (referred to as BATZ) was created of a bismuth antimony telluride matrix with both zinc antimony grain boundary modifications and inter-grain phonon scattering zinc oxide nanoparticles. The power factor augmentation, in conjunction with reduction of thermal conductivity, resulted in an 83% improvement to the figure of merit ZT compared to an analogous or equivalent sample without zinc-nanostructures (referred to as BAT). In addition, it is appreciated that for the purposes of the present invention, the term "analogous" and "analogous material" refers to a material having generally the same non-oxide matrix composition and crystallite or grain size as the modified nanocomposite disclosed and discussed below and in FIGS. 19-21.

The BATZ material was made by means of a wet-chemistry synthesis that first yielded an admixture of bismuth antimony telluride nanoparticles and zinc oxide nanoparticles. This nanoparticle mixture was then consolidated, by hot pressing, to form a BATZ nanocomposite. As indicated below, the BAT nanocomposite was formed in an analogous manner, excluding the presence of zinc oxide nanoparticles and thereby precluding the formation of complex zinc-nanostructures responsible for improving the ZT from 0.6 to 1.1 (at 100° C.) as shown in FIG. 19A.

Nanoparticle Synthesis:

The synthesis of the BAT and BATZ nanoparticles was conducted as follows. A reagent solution of sodium telluride hydride was made in the following manner. Water (103 mL) and tellurium powder (5.91 g) were added to a flask degassed with inert gas, rapidly stirred and then cooled in an ice water bath. Sodium borohydride (6.32 g) was then added, in portions, and the reaction was allowed to stir for at least 12 hours until all of the tellurium powder has dissolved. The product solution was filtered through a fitted glass filter, still excluding oxygen, to collect a merlot-colored filter cake product solution. The filter cake was then washed with water (15 mL), through the fritted glass filter, and combined with an initially collected quantity of sodium tellurium hydride solution.

A solution of water and 28% ammonium hydroxide (6.5 mL and 5.5 mL, respectively) was prepared, and a combination of potassium antimony tartrate (9.02 g) and bismuth citrate (1.54 g) were dissolved completely in the diluted ammonium hydroxide solution. The antimony and bismuth salts were dissolved in portions; rigorously dissolving each portion before adding more of the salts. The freshly prepared aqueous solution of antimony and bismuth salts was then added to a reaction flask that had previously been degassed with inert gas and charged with water (480 mL). For the BATZ synthesis, a finely dispersed aqueous suspension of zinc oxide nanoparticles was added to the reaction solution (2.27 g of zinc oxide nanoparticles in 68 mL water).

The collected sodium tellurium hydride solution was then added dropwise to the rapidly stirring reaction solution containing the dissolved bismuth and antimony salts and zinc oxide nanoparticle suspension. After addition of the sodium tellurium hydride solution was complete, the reaction was allowed to stir for an additional 20 minutes. The product was then collected using centrifugation and washed under an inert atmosphere in a Soxhlet apparatus with a solution of water, methanol, and 28% ammonium hydroxide (35/165/0.8 respectively by volume). A final rinsing with methanol was administered and the methanol-slurry of nanoparticle product was dried under an inert gas flow and then ground to a fine powder, in a glovebox.

Nanocomposite Sintering:

Sintering of the composite nanoparticle powders was performed using graphite punch and dies and a hot press. All samples were first baked at 400° C. for 20 minutes and then sintered at 400° C. and 100 MPa for 4 hours under an argon atmosphere.

Temperature dependent transport properties for the BAT and BATZ nanocomposites, between room temperature and 200° C., are shown in FIG. 19A-19E. The electrical conductivity of the BATZ sample is consistently higher over the entire temperature range measured as illustrated in FIG. 19B. For example, at 150° C., the BATZ material exhibited a 34% higher electrical conductivity versus the analogous BAT nanocomposite. Hall Effect measurements were conducted to probe the electrical conductivity improvement and the carrier concentration of the BAT control nanocomposite was insubstantially 6% greater than the quantity of charge carriers in the BATZ nanocomposite. However, the BATZ nanocomposite charge carrier mobility was found to be 67% higher than that of the BAT material and thereby was determined to dominate and be responsible for the measured increase in electrical conductivity. It is appreciated that the material property comparisons are consistent with the aforementioned zinc antimony grain boundary modification of the BATZ nanocomposite and it is fundamentally different than previous reports of grain boundary modification that relied on alkali metal salts or composites made from elemental chunks. It is also appreciated that zinc oxide is n-type, which means there may be an injection of minority carriers in the system due to the zinc oxide inclusions, but the BATZ nanocomposite is undoubtedly p-type.

The Seebeck coefficient was over 200 μV/K at temperatures below 150° C. for both BATZ and BAT as illustrated in FIG. 19C. The Seebeck coefficient of BATZ was lower than that of BAT below 150° C., but then tended to be higher above 150° C. Not being bound by theory, the smaller Seebeck coefficient at lower temperature is attributed to a higher carrier concentration in the heavily doped material, while the larger Seebeck coefficient of BATZ at higher temperature indicates suppression of minority carriers (electrons). As a result of better electrical properties, the BATZ material showed an overall improvement in the power-factor throughout the measured temperature range as illustrated in FIG. 19D.

The BATZ material thermal conductivity ranged from 0.4 to 0.6 W/mK. A maximum reduction of 41% in thermal conductivity (at 150° C.) was realized from adding zinc oxide nanoparticles as illustrated in FIG. 19E. The correlation of a stronger reduction in thermal conductivity at higher temperatures is consistent with the electrical measurement data. In addition, and even though higher electronic thermal conductivity is expected for the BATZ sample, the suppression of minority carriers contributed to the reduction of bipolar thermal conduction, which caused the overall dominance of phonon-driven thermal conductivity at temperatures higher than 150° C. Therefore, the inclusion of the zinc oxide nanoparticles was an effective means of phonon scattering, in such a thermoelectric system.

Figure 20A:
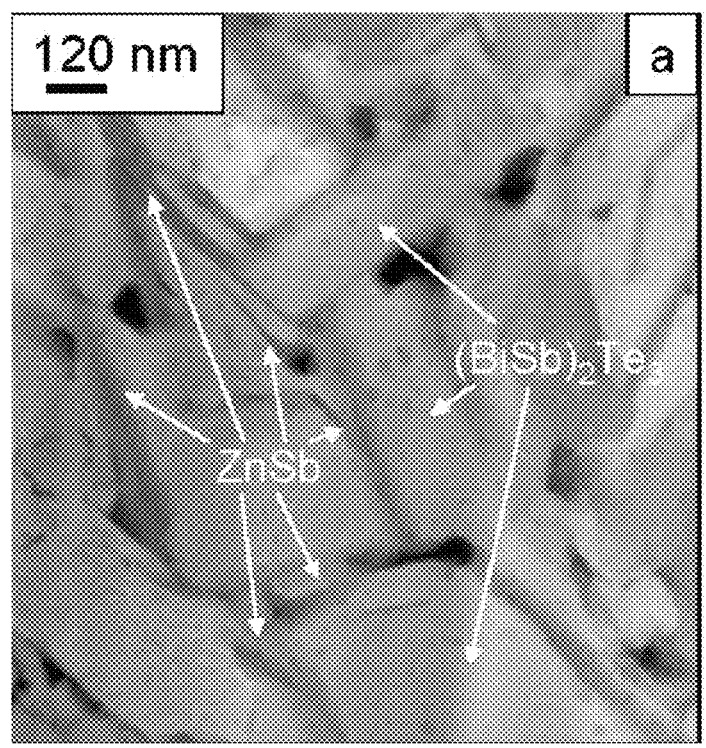
FIG. 20 is a transmission electron microscopy (TEM) image illustrating: (A) a bismuth antinomy telluride matrix with zinc antinomy modified grain boundaries; and (B) zinc oxide nanoparticles within the bismuth antinomy telluride matrix.
Figure 21:
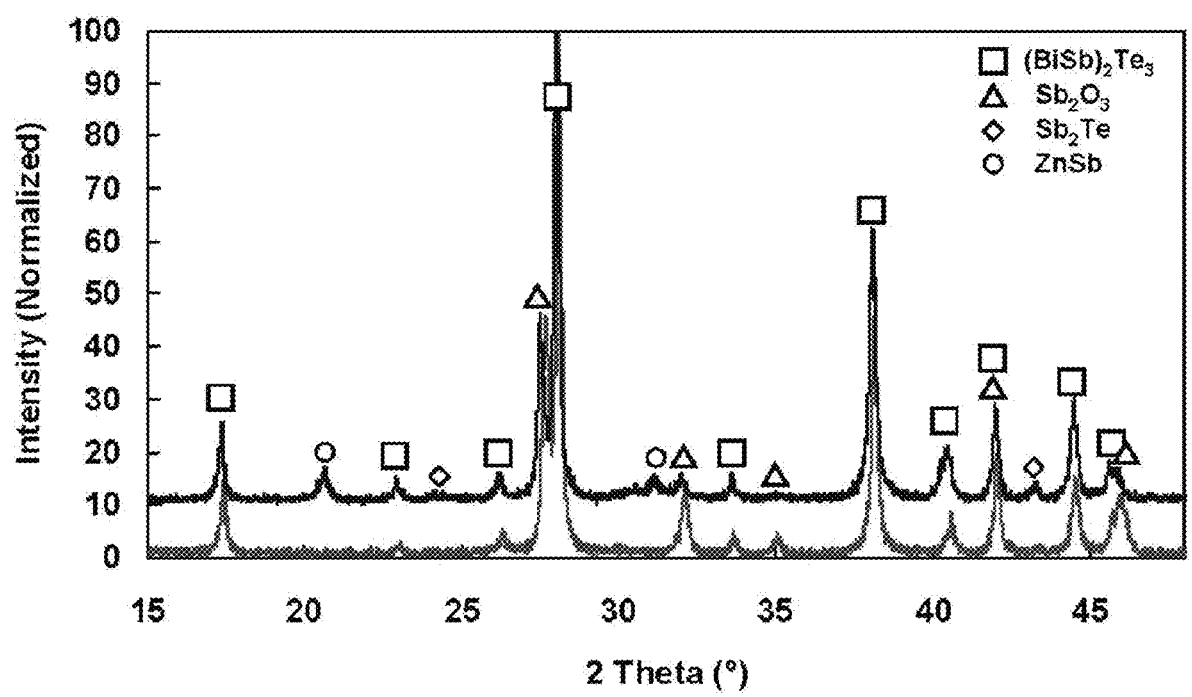
FIG. 21 is a graph illustrating the x-ray diffraction (XRD) results of the BATZ material.

Transmission electron microscopy (TEM) imaging was conducted to correlate the structural origin of the electrical conductivity increase in the presence of a reduced thermal conductivity in the BATZ material while maintaining a generally constant Seebeck coefficient when compared to the BAT material. Zinc antimony formed from a reaction of the nanocomposite constituents during the sintering process, and precipitated at the boundaries between bismuth antimony telluride grains in the BATZ material as illustrated in FIG. 20A. Composition determination was conducted with TEM-EDS and Z-contrast TEM. The zinc antimony phase identification was further supported by its identification in the XRD spectrum as shown in FIG. 21. Zinc antimony is an inter-metallic semiconductor and also a thermoelectric material. Both polycrystalline and thin films morphologies of zinc antimony show an electrical conductivity on the order of 40,000 S/m at room temperature, about 50% than that of the BATZ sample. Again, not being bound by theory, formation of zinc antimony at the host-host grains is expected to reduce the barrier potential and consequently reduce hole scattering. By reducing the interfacial electrical resistance in the grain, it results in a higher electrical conductivity and consequently increases the power factor. The presence of zinc antimony at the grain boundary does not pose a thermal resistance as its thermal conductivity is 1.5-2.5 W/mK at room temperature, which is higher than the BATZ nanocomposite. Based on the physical size of the formed zinc antimony, it is not expected to contribute to the phonon scattering phenomenon either, with an average width of 44±17 nm and length over 100 nm as illustrated in FIG. 20A. It is appreciated that the average width of the grain boundary is also the average thickness of the grain boundary.

Two other crystalline phases were identified in the XRD spectrum shown in FIG. 21, with bismuth telluride and antimony oxide present in both the BAT and BATZ nanocomposites. Comparison of peak widths, for the normalized XRD spectra, showed that the average crystallite sizes were quite similar between the two different materials. In addition, the bismuth antimony telluride lattice of the BATZ nanocomposite was slightly expanded with the inclusion of zinc-nanostructures. Such alternations to the lattice of the nanocomposite matrix were commonly observed throughout the hot-press sintered nanocomposites and the antimony oxide is believed to have formed while processing nanoparticle powders by brief contact with air. Based on reference intensity ratio analysis of the XRD spectra, the quantities of bismuth antimony telluride oxidized to form antimony oxide for BAT and BATZ materials were within 3% of each other, and therefore presumed to have an equivalent influence on the properties in both sintered materials.

Figure 20B:
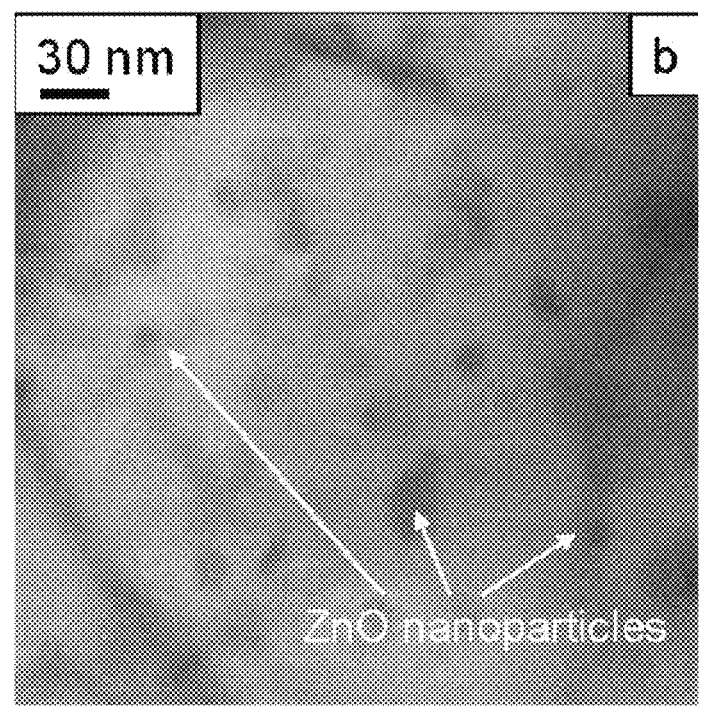

Zinc oxide nanoparticles were visible throughout the bismuth antimony telluride grains via TEM as shown in FIG. 20B. Characterization was, again, based on TEM-EDS and Z-contrast TEM, and the average diameter was measured to be 10±4 nm. Neither aggregation nor anomalous growth of the zinc oxide nanoparticles was observed. As expected based on the size of the zinc oxide nanoparticles, there was no indication of zinc oxide in the XRD spectrum of the BATZ nanocomposite and the absence of peaks in the XRD spectrum is an affirmation of consistent nanometer-dimensions for the occurrences of zinc oxide throughout the nanocomposite. Antimony oxide nanoparticles ranging 12 to 18 nm in diameter (in addition to the aforementioned large grains of antimony oxide reported by the XRD analysis) were also observed by TEM in the BATZ nanocomposite. These antimony oxide nanoparticles occurred too rarely to count for a meaningful average diameter calculation. In addition, and based on their scarcity, it is thought that the antinomy oxide nanoparticles do not appreciably influence the thermoelectric properties of the nanocomposite. Such antimony oxide nanoparticles were not observed by TEM in the BAT compaction and it is not believed that zinc oxide facilitates antimony oxide nanoparticle formation, but that antimony oxide nanoparticles were not observed with TEM due to their rarity.

The thermoelectric properties of the BATZ nanocomposite described were disentangled by the addition of phonon scattering zinc oxide nanoparticles and the formation of charge carrier mobility-enhancing zinc antimony grain boundaries. This effective decoupling of the electrical conductivity, Seebeck coefficient, and thermal conductivity, as shown here on multi-gram scale, is critical for the advancement of the field and its commercial viability. And in general, these two approaches to improving the ZT value, when combined in a single nanocomposite, offer a new hybrid methodology in thermoelectric material research.

As disclosed above, the plurality of material positions to be investigated can include a first component with a volume fraction of a second component ranging from 0.0 to 1.0. In some instances, the material compositions to be investigated can include the first component with a volume fraction of the second component ranging from 0.0 to 0.7. The plurality of thermal conductivity values are calculated as a function of the scattering cross section of the second component nanoparticles for the plurality of material compositions being investigated. In addition, the scattering cross section can be a function of the interfacial surface area of the second component nanoparticles for the plurality of material compositions being investigated. The function of the plurality of material compositions being investigated can include the size of the second component nanoparticles, the size distribution of the second component nanoparticles and an interfacial property of the second component nanoparticles. In some instances, an interfacial interaction property between the second component nanoparticles and the first component can be used.

It is appreciated that the thermoelectric device can be designed and developed using the process disclosed herein, the thermoelectric device having a first electrical contact, a second electrical contact, and a thermoelectric bulk material located within an electrical path between the first electrical contact and the second electrical contact. The thermoelectric bulk material can include a first powdered component having a particulate form, the first powdered component being electrically conducting, and a second powdered component having a particulate form, the second powdered component having an electrical conductivity substantially less than the first powdered component. The first and second powdered components can retain the particulate form in the bulk thermoelectric material and the thermoelectric bulk material can be a composite that has nanostructures of the first powdered component. The first component can be a metal or a semiconductor. The second component can be an electrical insulator in the form of a ceramic. It is appreciated that the process can also be used for semiconductor-metal and semiconductor-semiconductor thermoelectric material systems.

It is further appreciated that the bulk thermoelectric material can be an electrically conducting material such as a semiconductor or metal. In addition, the electrically conducting material can be an organic material, or an organic material such as an organic semiconductor.

In the temperature range between 300K to 500K, an n-type material such as $Bi_2Te_3$ or $Bi_2Se_3$ and/or the p-type material such as $Bi_2Te_3$ or $Sb_2Te_3$ can be used for the bulk thermoelectric material. For the temperature range between 500K to 700K, n-type materials such as PbTe or SnTe doped with Bi and/or p-type materials such as PbTe or SnTe can be used. In addition, materials such as ZnSb, SiGe, CoSb, CeFeCoSb, and alloys thereof can be used for the bulk thermoelectric material. Regarding nanocomposite thermoelectric materials, nanoparticles of insulating materials such as $SiO_2$, $ZnO$, $Al_2O_3$, $LaCoO_4$, $NaCoO_4$, $SnO_2$, $(ZnO)_x$ $(In_2O_5)_y$, $ZrO$, Y-stabilized $ZrO$, $ZrO_2$, yttria stabilized $ZrO_2$ (YSZ), $La_2O_3$ stabilized YSZ, other oxide materials, carbon nanoparticles, electrically insulating polymer nanoparticles, fullerenes such as $C_{60}$.

The invention is not restricted to the illustrative examples described above. The examples are not intended as limitations on the scope of the invention. Methods, apparatus, compositions and the like described herein are exemplary and not intended as limitations on the scope of the invention. Changes therein and other uses will occur to those skilled in the art. The scope of the invention is defined by the scope of the claims.

We claim:

1. A thermoelectric material comprising:
a first matrix phase;
an inter-grain phonon scattering second phase comprising a plurality of oxide nanoparticles; and
a plurality of third phase grain boundaries, wherein said plurality of third phase grain boundaries are zinc antimony modified grain boundaries consisting of zinc and antimony with an average thickness within a range of 2-75 nm and wherein said plurality of third phase grain boundaries have a grain boundary barrier height within a range of 10-300 meV.

2. The thermoelectric material of claim 1, wherein said first matrix phase has an average grain size within a range of 5-100 nm.

3. The thermoelectric material of claim 2, wherein said average grain size is within a range of 5-50 nm.

4. The thermoelectric material of claim 3, wherein said average grain size is within a range of 5-25 nm.

5. The thermoelectric material of claim 1, wherein said first matrix phase is a bismuth antimony telluride phase.

6. The thermoelectric material of claim 1, wherein said plurality of oxide nanoparticles have an average diameter within a range of 2-100 nm.

7. The thermoelectric material of claim 6, wherein said average diameter is within a range of 4-50 nm.

8. The thermoelectric material of claim 7, wherein said average diameter is within a range of 6-14 nm.

9. The thermoelectric material of claim 6, wherein said plurality of oxide nanoparticles are zinc oxide nanoparticles.

10. The thermoelectric material of claim 1, wherein said average thickness is within a range of 5-70 nm.

11. The thermoelectric material of claim 10, wherein said average thickness is within a range of 10-70 nm.

12. The thermoelectric material of claim 11, wherein said average thickness is within a range of 15-65 nm.

13. The thermoelectric material of claim 12, wherein said average thickness is within a range of 27-61 nm.

* * * * *

UNITED STATES PATENT AND TRADEMARK OFFICE
CERTIFICATE OF CORRECTION

PATENT NO. : 10,672,966 B2  
APPLICATION NO. : 14/303878  
DATED : June 2, 2020  
INVENTOR(S) : Debasish Banerjee et al.

Page 1 of 1

It is certified that error appears in the above-identified patent and that said Letters Patent is hereby corrected as shown below:

In the Specification

In Column 18, Line(s) 3, delete " $a_e = \int \int_{R,0}^{\infty,W} \left( q \cdot \sin\left(\frac{1\pi}{R}\right) v_{re} \right) dl dt$ " and insert -- $a_e = \iint_{R,0}^{\infty,W} \left( l * \sin\left(\frac{1\xi}{R}\right) v_{re} \right) dl dt$ --, therefor.

In Column 25, Line(s) 39, delete "fitted" and insert --fritted--, therefor.

Signed and Sealed this  
Eighteenth Day of August, 2020

Andrei Iancu  
*Director of the United States Patent and Trademark Office*